US011661673B1

(12) United States Patent
Syrkin et al.

(10) Patent No.: US 11,661,673 B1
(45) Date of Patent: *May 30, 2023

(54) HVPE APPARATUS AND METHODS FOR GROWING INDIUM NITRIDE AND INDIUM NITRIDE MATERIALS AND STRUCTURES GROWN THEREBY

(71) Applicant: Ostendo Technologies, Inc., Carlsbad, CA (US)

(72) Inventors: Alexander L. Syrkin, Montgomery Village, MD (US); Vladimir Ivantsov, Hyattsville, MD (US); Alexander Usikov, Rockville, MD (US); Vladimir A. Dmitriev, Gaithersburg, MD (US)

(73) Assignee: Ostendo Technologies, Inc., Carlsbad, CA (US)

( * ) Notice: Subject to any disclaimer, the term of this patent is extended or adjusted under 35 U.S.C. 154(b) by 74 days.

This patent is subject to a terminal disclaimer.

(21) Appl. No.: 17/329,129

(22) Filed: May 24, 2021

Related U.S. Application Data

(60) Division of application No. 14/836,789, filed on Aug. 26, 2015, now abandoned, which is a continuation of
(Continued)

(51) Int. Cl.
*C30B 25/08* (2006.01)
*C30B 25/16* (2006.01)
(Continued)

(52) U.S. Cl.
CPC ............ *C30B 25/08* (2013.01); *C30B 25/165* (2013.01); *C30B 29/403* (2013.01); *C30B 29/68* (2013.01);
(Continued)

(58) Field of Classification Search
CPC ........ C30B 25/02; C30B 29/403; C30B 23/02
See application file for complete search history.

(56) References Cited

U.S. PATENT DOCUMENTS 3,959,446 A 5/1976 Mazdiyasni et al.
4,144,116 A 3/1979 Jacob et al.
(Continued)

OTHER PUBLICATIONS

Bhuiyan, Ghani A., "Indium Nitride (InN): A review of growth, characterization and properties," Journal of Applied Physics, vol. 94, Issue 5 (Sep. 1, 2003), pp. 2779-2808.
(Continued)

*Primary Examiner* — Matthew J Song
(74) *Attorney, Agent, or Firm* — Greg Caldwell, Esq.; W. Eric Boyd, Esq.

(57) ABSTRACT

Hydride phase vapor epitaxy (HVPE) growth apparatus, methods and materials and structures grown thereby. An HVPE reactor includes generation, accumulation, and growth zones. A source material for growth of indium nitride is generated and collected inside the reactor. A first reactive gas reacts with an indium source inside the generation zone to produce a first gas product having an indium-containing compound. The first gas product is cooled and condenses into a liquid or solid condensate or source material having an indium-containing compound. The source material is collected in the accumulation zone. Vapor or gas resulting from evaporation of the condensate forms a second gas product, which reacts with a second reactive gas in the growth zone for growth of indium nitride.

8 Claims, 33 Drawing Sheets

Related U.S. Application Data application No. 11/691,940, filed on Mar. 27, 2007, now abandoned.

(60) Provisional application No. 60/786,327, filed on Mar. 27, 2006.

(51) Int. Cl.
*H01L 21/02* (2006.01)
*C30B 29/68* (2006.01)
*C30B 29/40* (2006.01)
*H01L 29/20* (2006.01)

(52) U.S. Cl.
CPC ...... *H01L 21/0254* (2013.01); *H01L 21/0262* (2013.01); *H01L 29/2003* (2013.01)

(56) References Cited

U.S. PATENT DOCUMENTS

| | | | |
|---|---|---|---|
| 5,254,210 A | 10/1993 | Jones et al. | |
| 5,814,239 A | 9/1998 | Kaneko et al. | |
| 6,086,673 A | 7/2000 | Molnar | |
| 6,113,985 A | 9/2000 | Suscavage et al. | |
| 6,156,581 A | 12/2000 | Vaudo et al. | |
| 6,218,269 B1 | 4/2001 | Nikolaev et al. | |
| 6,472,300 B2 | 10/2002 | Nikolaev et al. | |
| 6,476,420 B2 | 11/2002 | Nikolaev et al. | |
| 6,479,839 B2 | 11/2002 | Nikolaev et al. | |
| 6,555,452 B2 | 4/2003 | Nikolaev et al. | |
| 6,559,038 B2 | 5/2003 | Nikolaev et al. | |
| 6,559,467 B2 | 5/2003 | Nikolaev et al. | |
| 6,562,124 B1 | 5/2003 | Ivantzov et al. | |
| 6,573,164 B2 | 6/2003 | Tsvetkov et al. | |
| 6,576,054 B1 | 6/2003 | Melnik et al. | |
| 6,579,359 B1 | 6/2003 | Mynbaeva et al. | |
| 6,599,133 B2 | 7/2003 | Nikolaev et al. | |
| 6,613,143 B1 | 9/2003 | Melnik et al. | |
| 6,616,757 B1 | 9/2003 | Melnik et al. | |
| 6,656,272 B2 | 12/2003 | Tsvetkov et al. | |
| 6,656,285 B1 | 12/2003 | Melnik et al. | |
| 6,660,083 B2 | 12/2003 | Tsvetkov et al. | |
| 6,676,752 B1 | 1/2004 | Suscavage et al. | |
| 6,706,119 B2 | 3/2004 | Tsvetkov et al. | |
| 6,849,862 B2 | 2/2005 | Nikolaev et al. | |
| 6,890,809 B2 | 5/2005 | Karpov et al. | |
| 6,936,357 B2 | 8/2005 | Melnik et al. | |
| 6,955,719 B2 | 10/2005 | Dmitriev et al. | |
| 7,279,047 B2 | 10/2007 | Melnik et al. | |
| 7,501,023 B2 | 3/2009 | Dmitriev et al. | |
| 7,556,688 B2 | 7/2009 | Melnik et al. | |
| 7,611,586 B2 | 11/2009 | Melnik et al. | |
| 7,670,435 B2 | 3/2010 | Tsvetkov et al. | |
| 7,727,333 B1 | 6/2010 | Syrkin et al. | |
| 2002/0017650 A1 | 2/2002 | Nikolaev et al. | |
| 2002/0047135 A1 | 4/2002 | Nikolaev et al. | |
| 2002/0152951 A1* | 10/2002 | Tsvetkov | C30B 25/16 257/E21.108 |
| 2003/0013222 A1 | 1/2003 | Trassoudaine et al. | |
| 2003/0049898 A1 | 3/2003 | Karpov et al. | |
| 2003/0205193 A1 | 11/2003 | Melnik et al. | |
| 2004/0137657 A1 | 7/2004 | Dmitriev et al. | |
| 2005/0142391 A1 | 6/2005 | Dmitriev et al. | |
| 2005/0161697 A1* | 7/2005 | Nakahata | C30B 25/02 257/E21.127 |
| 2005/0164044 A1 | 7/2005 | Melnik et al. | |
| 2005/0212001 A1 | 9/2005 | Melnik et al. | |
| 2005/0244997 A1 | 11/2005 | Melnik et al. | |
| 2006/0011135 A1 | 1/2006 | Dmitriev et al. | |
| 2006/0280668 A1 | 12/2006 | Dmitriev et al. | |
| 2007/0032046 A1 | 2/2007 | Dmitriev et al. | |
| 2008/0022926 A1 | 1/2008 | Melnik et al. | |
| 2008/0257256 A1 | 10/2008 | Melnik et al. | |
| 2009/0050913 A2 | 2/2009 | Melnik et al. | |
| 2009/0092815 A1 | 4/2009 | Dmitriev et al. | |
| 2009/0130781 A1 | 5/2009 | Dmitriev et al. | |
| 2009/0286063 A2 | 11/2009 | Dmitriev et al. | |
| 2009/0286331 A2 | 11/2009 | Dmitriev et al. | |

OTHER PUBLICATIONS

Dwikusuma, F., et al., "Hydride Vapor Phase Epitaxy Growth of Nitrides," Vacuum Science and Technology: Nitrides as seen by the technology, (2002), pp. 79-103.

Final Office Action for U.S. Appl. No. 11/691,940, dated Jan. 21, 2015, 10 pages.

Final Office Action for U.S. Appl. No. 11/692,136, dated Nov. 27, 2009, 6 pages.

Final Office Action for U.S. Appl. No. 14/836,789, dated Sep. 20, 2018, 13 pages.

Final Office Action for U.S. Appl. No. 14/836,789, dated Aug. 30, 2019, 14 pages.

Kikuchi, J, et al.,"Thermodynamic Analysis of Various Types of Hyrdride Vapor Phase Epitaxy System for High-Speed Grown of InN", Japanese Journal of Applied Physics vol. 45, No. 45, (Nov. 10, 2006), pp. L 1203-L1205.

Kumagai, Y., et al., "Thermodynamics on tri-halide vapor-phrase epitaxy epitaxy of GaN and InxGa1-xN using gaCl3 and Incl3", Journal of Crystal Growth, vol. 231, (2001), pp. 57-67.

Marasina, L.A., et al., "Preparation of InN Epitaxial Layers in InCl3-NH3 System", Kristall und Technik, vol. 12 , No. 6, (1977), pp. 541-545.

Non-Final Office Action for U.S. Appl. No. 11/691,940, dated Jul. 2, 2014, 11 pages.

Non-Final Office Action for U.S. Appl. No. 11/692,136, dated Dec. 2, 2008, 7 pages.

Non-Final Office Action for U.S. Appl. No. 11/692,136, dated Jun. 22, 2009, 7 pages.

Non-Final Office Action for U.S. Appl. No. 14/836,789, dated Nov. 15, 2017, 10 pages.

Von-Final Office Action for U.S. Appl. No. 14/836,789, dated Feb. 25, 2019, 13 pages.

Notice of Allowance for U.S. Appl. No. 11/692,136, dated Jan. 20, 2010, 4 pages.

Restriction Requirement for U.S. Appl. No. 14/836,789, dated Oct. 4, 2017, 7 pages.

Sato, Y., et al., "Growth of InN thin films by hydride vapor phase epitaxy", Journal of Crystal Growth 144 , (1994), pp. 15-19.

Sato, Y., et al., "Hydride Vapor Phase Epitaxy of InxGa1-xN Thin Films", Japanese Journal of Applied Physics. vol. 36, (1997), pp. 4295-4296.

Song, D. Y., et al., "Morphological, electrical, and optical properties of InN grown by hydride vapor phase epitaxy on sapphire and template substrates", Journal of Applied Physics. 99, (Jun. 1, 2006), pp. 116103-1 to 116103-3.

Sunakawa, H., et al., "Growth of InN by Chloride-Transport Vapor Phase Epitaxy", Japan Journal of Applied Physics vol. 35(2)-11 A, (1996), pp. L1395-L1397.

Takahashi, N., et al., "Vapor phase epitaxy of InN using InCl and InCl3 sources", Journal of Crystal Growth vol. 172, (1997), pp. 298-302.

Takahashi, N., et al., "Vapor-phase epitaxy of InxGa1-xN Using Chloride Sources", Journal of Crystal Growth vol. 189/ 190, (1998), pp. 37-41.

Takahashi, N., et al., "Growth of InN at High Temperature by Halide Vapors Phase Epitaxy", Japan Journal of Applied Physics vol. 36(2)-6B, (1997), pp. L743-L745.

Takahashi, N., et al., "Vapor phase epitaxy of InxGa1-xN Using InCl3, GaCl3 and NH3 Sources", Japanese Journal of Applied Physics vol. 36, (1997), pp. L601-L603.

* cited by examiner

600

- 602 – Load indium inside generation zone
- 604 – Flush / fill HVPE reactor
- 606 – Heat indium
- 608 – Introduce first reactive gas into generation zone
- 610 – Reaction of indium and first reactive gas to form first gas product that includes one or more compounds containing indium
- 612 – Transport first gas product to accumulation zone
- 614 – Cool / condense first gas product in accumulation zone
- 616 – Collect condensate / source material in vessel in accumulation zone
- 618 – Cease flow of first reactive gas
- 620 – Cool indium in generation zone
- 622 – If necessary, introduce substrates into pre-growth zone inside reactor
- 624 – If necessary, move substrates from pre-growth zone to growth zone
- 626 – If necessary, treat substrates in growth zone using reactive gas
- 628 – Cease flow of reactive gas into growth zone
- 630 – Adjust temperature of source material / condensate in accumulation zone if necessary
- 632 – Evaporation of source material / condensate to form second gas product having one or more compounds containing indium
- 634 – Transport second gas product to growth zone
- 636 – Introduce second reactive gas into growth zone
- 638 – Reaction of second gas product and second reactive gas
- 640 – Grow indium nitride
- 642 – Cool / unload grown indium nitride
- 644 – Cease gas flows
- 646 – Move substrates to cool-down zone

Figure 6

(Generation on Accumulation)

(Growth)

(Generation/Accumulation (Growth)

HVPE APPARATUS AND METHODS FOR GROWING INDIUM NITRIDE AND INDIUM NITRIDE MATERIALS AND STRUCTURES GROWN THEREBY

CROSS-REFERENCE TO RELATED APPLICATIONS

This application is a divisional of U.S. patent application Ser. No. 14/836,789, filed on Aug. 25, 2015 and abandoned as of May 23, 2021, which is a continuation of U.S. patent application Ser. No. 11/691,940, filed on Mar. 27, 2007 and abandoned as of Mar. 9, 2016, which claims the benefit of U.S. Provisional Application No. 60/786,327, filed Mar. 27, 2006, the entire contents of which are hereby incorporated by reference herein.

FIELD OF THE INVENTION

The present inventions relate generally to methods and systems for fabricating group III nitride materials and resulting materials and semiconductor devices and, more particularly, to methods and systems for fabricating indium nitride materials and related structures using hydride vapor phase epitaxy (HVPE).

BACKGROUND

Group III-N nitride compounds and their alloys, including GaN, AlN, GaAlN and InN have been developed for various optoelectronic and electronic applications. InN has received increased attention for use in narrow band gap semiconductor devices. InN materials and InGaN alloys may have desired material characteristics and open the door to new devices and applications including solar cells, high-speed electronics and short-wavelength and long-wavelength light emitters such as ultraviolet (UV), violet, blue, and green, yellow, red and infrared light emitting devices. While InN materials and related devices may hold promise for new devices and applications, growth of high quality InN materials for use in such devices and applications has been challenging.

For example, it is known to grow InN materials using Metal Organic Chemical Vapor Deposition (MOCVD). With MOCVD, group III-V compounds are grown from the vapor phase using metal organic compounds as sources of the Group III metals. Trimethylindium (TMI) is typically used as an indium source material, trimethylaluminum (TMA) is used as an aluminum source material and trimethylgallium (TMG) is used as a gallium source material. Ammonia gas is typically used as a nitrogen source.

These materials are supplied to a MOCVD reactor from source tanks that are outside the reactor. Inside the MOCVD reactor, a metal organic material source reacts with ammonia resulting in the deposition of an epitaxial layer of a nitride material on a substrate. In order to control the electrical conductivity of the grown materials, electrically active impurities are introduced during material growth. Undoped III-V nitride compounds normally exhibit n-type conductivity. Donor impurities, such as silicon or germanium, are used to control n-type conductivity and obtain materials with low electrical resistivity. In order to obtain nitride materials having p-type conductivity, magnesium impurity in the form of metal organic compounds is introduced in the MOCVD reactor.

While MOCVD has been used with some effectiveness in the past for growth of certain materials, MOCVD has limited applicability for growth of high quality InN since InN-based materials grown using MOCVD suffer from high defect density, poor conductivity control, and non uniformity. For example, green LEDs based on InGaN alloy materials with relatively high InN content (more than 20 mol. %) and grown using MOCVD show low efficiency and low output power. Further, nitride-based yellow and red LEDs require higher InN content and currently are not commercially available due to poor performance. These limitations inhibit the development of high quality InN that is required for improved semiconductor devices useful for applications including high speed communication terahertz electronics, solar sells, and advanced sensors.

Other limitations of MOCVD include high fabrication costs due to high costs of source materials, low deposition rates, and the need for sophisticated growth procedures and apparatuses. For example, MOCVD utilizes a high vacuum environment and associated pumping processes and machinery. Further, deposition rates using MOCVD is about 1-2 microns per hour, which limit the thicknesses of materials that can be grown by MOCVD and limit or prohibit effective growth of bulk materials.

It is also known to grow InN materials using Molecular Beam Epitaxy (MBE). MBE, however, suffers many of the same shortcomings as MOCVD. For example, MBE involves high fabrication costs and operation in a vacuum environment. Further, MBE techniques also suffer from slow deposition rates, which limit the thicknesses of materials grown by MOCVD and limit or prohibit effective growth of bulk materials.

HVPE has been investigated for fabricating group III-V nitride materials. HVPE offers a number of advantages over other fabrication methods including low defect densities, improved growth rates, controllable doping, less complicated equipment and reduced fabrication costs. Further, HVPE fabrication can be performed at atmospheric pressure and, thereby eliminating the need for vacuum equipment. HVPE is also suitable for mass production of semiconductor materials, structures and devices due to its low cost, excellent material characteristics, flexibility of growth conditions, and good reproducibility.

For example, HVPE can be used to achieve deposition rates of about 200 microns per hour to grow bulk GaN and AlN materials with high crystalline quality. It is known that in nitride materials grown on foreign substrates, like sapphire, defect density rapidly decreases with layer thickness. Thus, the ability to rapidly deposit layers having thicknesses of about 10 to 100 microns and thicker using HVPE reduces defects and provides higher quality devices.

A limited number of publications have discussed theoretical aspects or actual growth of InN using HVPE. However, growth of high quality In-containing nitride materials using HVPE has been challenging. For example, InN and InGaN layers that have been grown using HVPE have poor crystalline structure, high defect densities, and bad uniformity. One known approach uses an indium metal source or $InCl_3$ source that is located outside the growth reactor to grow materials containing InN. These configurations and techniques, however, result in InN materials having poor material properties.

Another known approach is to pre-synthesize an InCh source material outside of the reactor and placing the synthesized source inside the reactor and transporting the source material to the to the growth zone using an inert gas. However, this technique also results in poor quality InN, possibly due to source contamination that occurred as a result or after the synthesis of the source outside of the HVPE reactor. For example, in one study, the smallest value of the full width at half maximum (FWHM) of x-ray rocking curves using prior HVPE methods is about 1482arc seconds for the (00.2) InN peak, and the x-ray rocking curve data for the (10.2) InN reflection, which can be measured only for high crystal quality materials, were not reported.

Accordingly, it would be desirable to have HVPE reactors and HVPE growth methods for growing high quality indium-containing nitride materials and structures, such as InN, InGaN, and InGaAlN. Further, it would be desirable to be able to grow such materials and structures throughout their composition ranges. Additionally, it would be desirable to grow high quality InN materials and structures with greater thicknesses than known systems. It would also be desirable to be able to generate source materials inside a HVPE reactor rather than outside the reactor in order to reduce contamination and fabricate InN materials with low defect densities.

SUMMARY

In accordance with one embodiment is a method of growing indium nitride in a hydride vapor phase epitaxy reactor. The method includes generating a source material inside the reactor and having a compound that includes indium, collecting the source material inside the reactor, and growing indium nitride inside the reactor using collected source material.

In accordance with another embodiment is a method of growing indium nitride in a hydride vapor phase epitaxy reactor that includes introducing indium and a first reactive gas into the reactor and producing a first gas product, which is the result of a reaction of indium and the first reactive gas. The method also includes cooling the first gas product so that the first gas product condenses into a condensate, which has a compound containing indium. The internally generated condensate is collected inside the reactor and evaporated to produce a second gas product. The resulting second gas product includes a compound containing indium. The method also includes introducing a second reactive gas into the reactor, and growing indium nitride inside the reactor by a reaction of the second reactive gas and the second gas product resulting from evaporation of the collected condensate.

In another embodiment, a method of growing indium nitride in a hydride vapor phase epitaxy reactor includes collecting a condensate having a compound containing indium inside the reactor and growing indium nitride by a reaction of a reactive gas and evaporated condensate. The condensate is formed by condensation of a product of a reaction of another reactive gas and indium.

In a further alternative e3mbodiment, a hydride vapor phase epitaxy reactor for growing indium nitride includes a collection zone and a growth zone. The collection zone is configured to receive a first gas product, which is generated inside the reactor and that is a product a reaction of indium and a first reactive gas. The first gas product condenses into a source4 material that is collected in the collection zone. The collection zone is also configured to generate a second gas product, which is a product of evaporation of collected source material. The grown zone configured to receive a second reactive gas and to receive the second gas product from the collection zone. In the grown zone, indium nitride is grown by a reaction of the second gas product and the second reactive gas.

In another embodiment, a hydride vapor phase epitaxy reactor for growing indium nitride includes a generation zone, a collection zone and a growth zone. The generation zone includes indium and is configured to receive a halogen or halogen hydride gas. A reaction of indium and the halogen or halogen hydride gas in the generation zone produces a first gas product. The collection zone is configured to receive the first gas product from the generation zone and cool the first gas product to produce a condensate. The condensate includes a compound that contains indium. Condensate is accumulated in the collection zone and evaporated resulting in a second gas product. The growth zone is configured to receive the second gas product and to receive a second reactive gas, which react for growth of indium nitride in the growth zone.

In an alternative embodiment, an indium nitride material grown by hydride vapor phase epitaxy is such that a full width at half maximum (FWHM) of an omega-scan x-ray rocking curve for the indium nitride is less than 1200 ar seconds for the (10.2) peak and less than 600 arc seconds for a (00.2) peak.

In another embodiment, a semiconductor structure grown using hydride vapor phase epitaxy includes a substrate and first and second epitaxial layers. At least one epitaxial layer is a single crystal indium nitride layer, and a full width at half maximum (FWHM) of an x-ray omega scan rocking curve for the at least one indium nitride layer is less than 1200 arc seconds for a (10.2) peak, and a full width at half maximum (FWHM) of an x-ray omega scan rocking curve for the at least one indium nitride layer is less than 450 arc seconds for a (00.2) peak).

In a further alternative embodiment, a semiconductor structure grown using hydride vapor phase epitaxy is an indium nitride nano-structure having a full width at half maximum (FWHM) of an x-ray omega scan rocking curve of each single crystal indium nitride layer is less than 1000 arc seconds for a (10.2) peak, e.g. less than about 960 arc seconds, and a full width at half maximum (FWHM) of an x-ray rocking curve of each single crystal indium nitride layer is less than 600 arc seconds for a (00.2) peak, e.g. less than 300 arc seconds.

In another alternative embodiment, a semiconductor structure includes an indium nitride nano-structure that is grown by hydride vapor phase epitaxy.

In one or more embodiments, the source material can be the result of condensation of a gas that results from a reaction of indium and a reactive gas, such as HCl or another suitable reactive gas. The resulting condensate or source material generated inside the hydride vapor phase reactor (e.g. within a growth zone) can be a liquid or a solid, which is accumulated inside the reactor (e.g., within a collection zone). The first gas product can be generated in a zone that differs from the zone in which the source material or condensate is collected. Alternatively, a single vessel or container can be used to hold an indium source and condensate. Thus, the first gas product and the condensate can be produced in the same or different zones. The condensate is evaporated to form a second gas product, and the resulting gas or vapor is provided to a growth zone. A second reactive gas, such as ammonia, is also introduced into the growth zone to react with second gas product, thereby resulting in growth of indium nitride.

In one or more embodiments, the source material includes an indium-containing compound, such as $InCl_3$. The source material can include other indium-containing compounds. In one or more embodiments, indium nitride that is grown using hydride vapor phase epitaxy is such that a full width at half maximum (FWHM) of an x-ray □-scan rocking curve for the indium nitride is less than 1200 arc seconds for a (10.2) peak, and a full width at half maximum (FWHM) of an x-ray □-scan rocking curve for the indium nitride is less than 300 arc seconds for a (00.2) peak. Grown indium nitride can have an edge photoluminescence peak at a photon energy of about 0.95 eV or less at ambient temperature.

One or more embodiments involve growth of a single crystal indium nitride layer on a substrate, growth of multiple single crystal indium nitride layers, growth of a single crystal indium nitride layer on another layer that is not indium nitride, and growth of a single crystal indium nitride layer on another single crystal indium nitride layer (InN-on-InN). When multiple indium nitride layers are grown, they may have different characteristics, e.g., different dopants. Grown indium nitride layers can, for example, have a thickness greater than 1 nm. Additionally, single crystal indium nitride boules or boule-like structures can be grown. Such structures can have (x,y,z) dimensions each exceeding about O 0.2 centimeter.

Further, a semiconductor structure can include one or more single crystal epitaxial indium nitride layers and one or more other Group III-V epitaxial layers. For example, an epitaxial structure can include a single crystal indium nitride layer grown on a substrate, and a group III-V layer other than indium nitride grown on the single crystal indium nitride layer. As a further example, one or more embodiments involve growth of single crystal indium nitride layers and growth of one or more GaN, AlGaN, InGaN and/or AlN layers.

BRIEF DESCRIPTION OF THE DRAWINGS

FIG. 6 is a flow chart of a method of generating and accumulating an indium source material inside a HVPE reactor and growing indium-containing nitride materials according to another embodiment;

DETAILED DESCRIPTION

Figure 1:
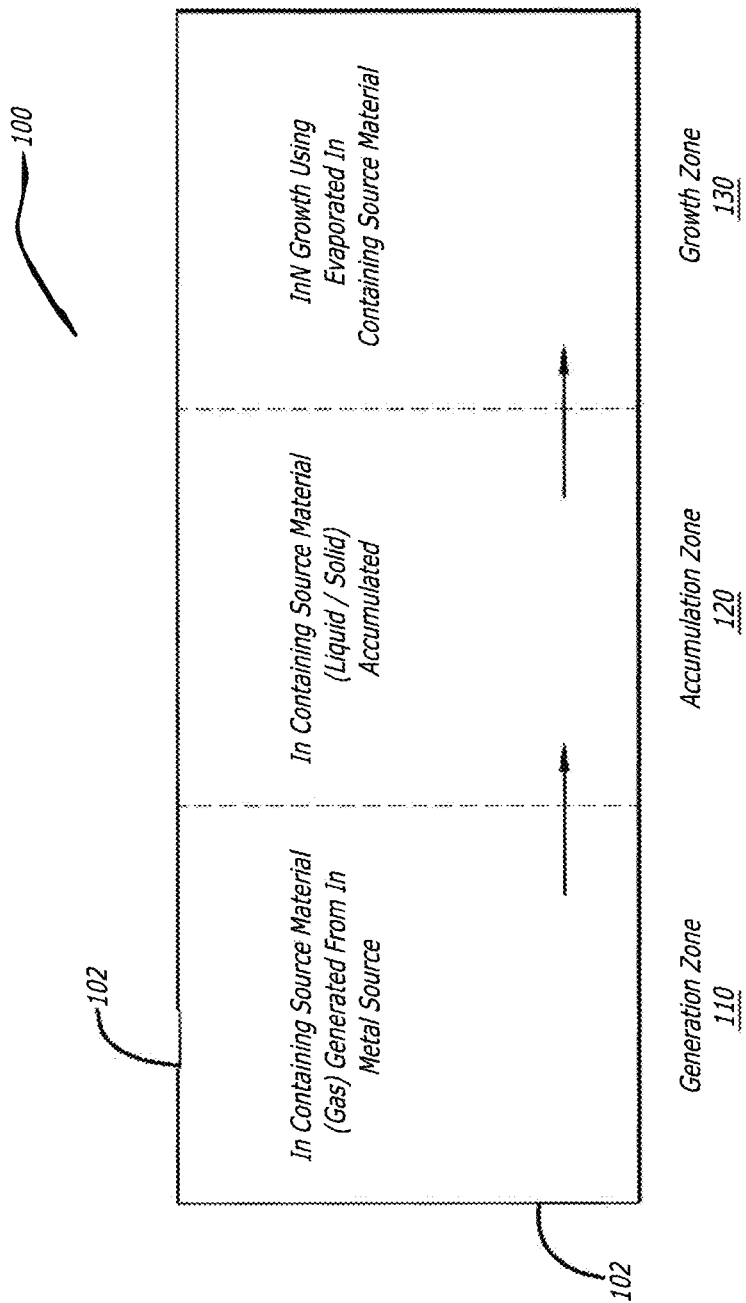
FIG. 1 generally illustrates a HVPE apparatus for generating and accumulating an indium source material inside the reactor according to one embodiment.

Embodiments provide HVPE growth apparatus or reactors, fabrication methods and resulting high quality, low defect density InN materials, semiconductor structures including high quality indium-containing nitride materials that are fabricated using an internally generated indium source material. Embodiments can be used to prepare indium-containing nitride materials such as InN, InGaN, InAlN, and InGaAlN, and indium-containing micro-structures and nano-structures. This specification refers to InN or indium nitride for purposes of explanation, however, persons skilled in the art will appreciate that embodiments can be applied to fabricate other indium-containing nitride materials. Indium nitride materials grown by embodiments have improved material parameters and uniformity and enable various types of devices to be fabricated to provide new device structures, capabilities and applications.

For example, improved material qualities are reflected in narrower widths of x-ray diffraction rocking curves. In this regard, x-ray rocking curve measurements can be performed for several x-ray diffraction reflections (peaks). Accepted reflections for group III nitride materials include the (00.2) symmetric and (10.2) asymmetric reflections based on $\omega$-scan geometry and $\omega$-$2\Theta$ geometries. Improved material qualities are also reflected in improved surface roughness and optical properties, such as photo luminescence (PL) properties including PL peak wavelength and width (full width half maximum or "FWHM") of specific (band gap related) PL peaks.

Embodiments advantageously generate source materials that are used to grow indium nitride inside the reactor rather than introducing external source materials into the reactor or synthesizing the source material outside the reactor. Embodiments achieve these advantages by condensing an indium-containing gas inside the reactor into an indium-containing liquid and/or solid, and collecting the liquid so that vapor or gas resulting from evaporation of the liquid can be used as an indium source material that is transported to a growth zone where it reacts with a reactive gas to grow high quality indium nitride material. For example, indium nitride materials were grown and had a full width at half maximum (FWHM) x-ray $\omega\omega$ scan rocking curve that is less than 1200 arc seconds for the (10.2) peak and less than 600 arc seconds for the (00.2) peak, e.g., less than 450 arc seconds for the (00.2) peak or less than 300 arc seconds for the (00.2) peak. Further, the high material quality of grown InN epitaxial layers is supported by results of room temperature optical characterization of grown materials providing near band gap photo luminescent emission peaking at a wavelength longer than 1300 nm corresponding to photon energy of 0.95 eV, and having the FWHM below 300 meV, e.g., about 1650 nm and 150 meV, respectively. In addition to improved material quality, embodiments also advantageously eliminate the need for vacuum equipment and achieving high deposition rates since HVPE apparatus embodiments operate at atmospheric pressure. Further, embodiments allow the internally generated source material to be moved inside the reactor so that indium source materials can be controllably positioned and moved inside the reactor to adjust temperature and gas parameters and achieved desired growth.

Apparatus and method embodiments can be used for growth of various materials and structures including low defect density epitaxial InN layers, epitaxial InN and group III-V layers, multi-layer InN structures, InN micro-structures, and InN nano-structures having high quality InN materials. Further, embodiments can be implemented using various substrates and semiconductor templates. Growth conditions, such as doping, temperature, growth rate, layer composition, electrical conductivity, etc. for each layer can be controlled independently. Further aspects and advantages of embodiments are described with reference to the accompanying Figures.

FIG. 1 generally illustrates a HVPE reactor or growth apparatus 100 (generally growth apparatus 100) having an outer wall 102 and three internal zones—a generation zone 110, an accumulation zone 120, and a growth zone 130. Indium source material is advantageously generated inside the growth apparatus 100, i.e., within the generation zone 110, thereby advantageously eliminating the need to provide externally created indium source materials into the growth apparatus.

The growth apparatus 100 can be a hot wall quartz tube reactor having a resistively heated furnace (not shown in FIG. 1). The reactor tube may have vertical, horizontal (as shown in FIG. 1), or combined vertical-horizontal geometry. In the illustrated embodiment, the growth apparatus 100 has a cylindrical cross-section. However, other growth apparatus 100 configurations can be used such as a "tube" with a rectangular cross-section. Further, although the three zones 110, 120 and 130 are shown inside the growth apparatus 100 with reference to dividing lines, in practice, the zones 110, 120 and 130 are defined by temperature.

For example, the growth apparatus 100 can be a multi-zone resistive heater furnace, and the temperature of different sections of the reactor 100 can be independently controllable to provide different temperature profiles and zones that are defined using one or more heaters that at least partially surround the section of the growth apparatus 100. Thus, each zone 110, 120 and 130 inside the growth apparatus 100 has a particular temperature profile for a different fabrication purpose.

Figure 2:
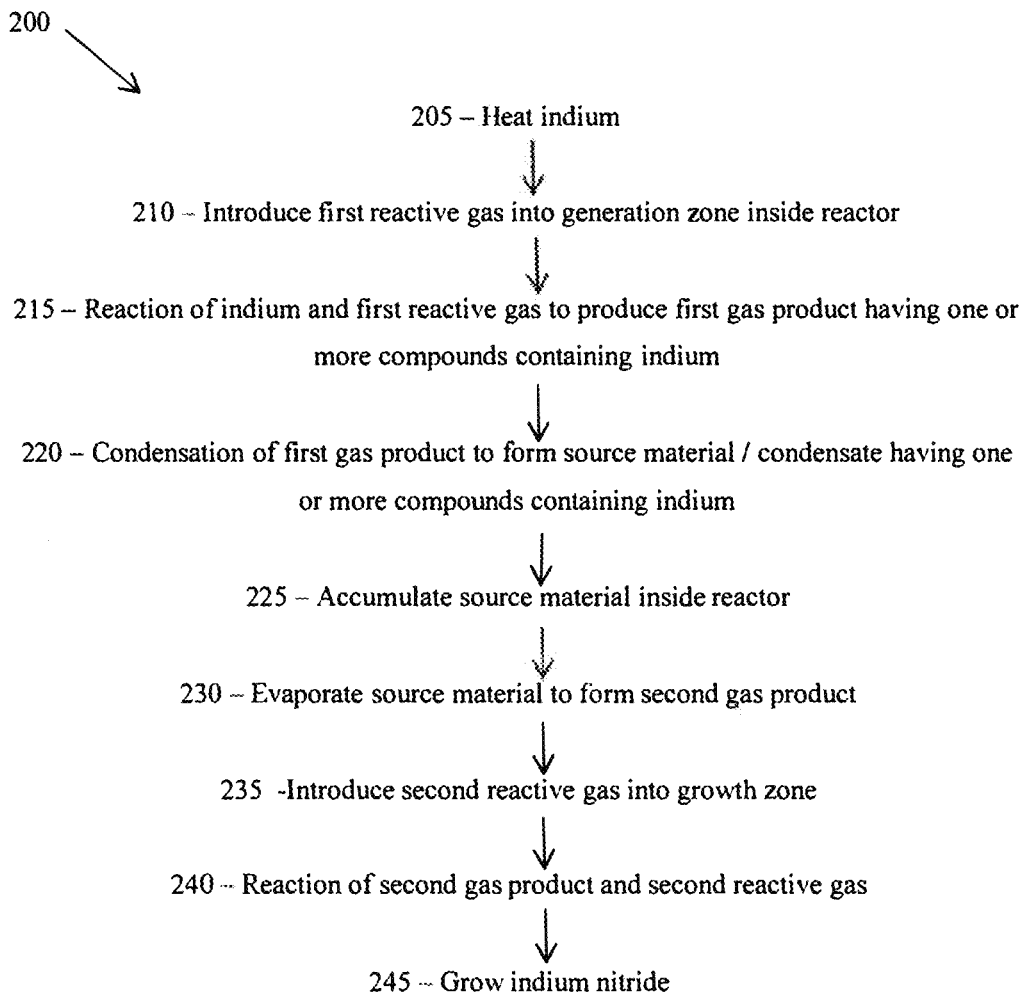
FIG. 2 is a flow chart of a method of generating and accumulating an indium source material inside a HVPE reactor and growing indium-containing nitride materials according to one embodiment.

Referring to FIG. 2, a method 200 of growing indium nitride using HVPE according to one embodiment includes heating an indium source at stage 205. At stage 210, a first reactive gas is introduced into the source generation zone. At stage 215, the first reactive gas and gas or vapor from the indium source react in the generation zone to produce a first gas product that includes one or more indium-containing compounds. At stage 220, the first gas product is cooled and condenses from a gas state to a liquid or solid state to form a source material that includes one or more indium-containing compounds. Persons skilled in the art will appreciate that embodiments may involve a source material that is liquid and/or a solid and that may contain one or multiple compounds that contain indium. Thus, this specification refers to a "liquid/solid" source material since the source material may be a liquid and/or a solid having one or more indium-containing compounds. At stage 225, the resulting liquid/solid source material is collected in the accumulation zone. At stage 230, when the apparatus is configured for growth, vapor or gas is generated from the liquid/solid source material, e.g., by evaporation. At stage 235, a second reactive gas is introduced into the growth zone to react with a second gas product resulting from vapor or gas generated, e.g., by evaporation at stage 240. As a result, at stage 245, high quality, low defect density indium nitride is grown in the growth zone.

With embodiments, source materials containing indium that are used to grow high quality indium nitride are generated inside the reactor. Further, with embodiments, a liquid/solid source material that includes one or more indium-containing compounds is collected inside the reactor. Embodiments, therefore, eliminate the need to generate or synthesize source materials outside of the growth apparatus. Persons skilled in the art will appreciate that FIG. 2 and the particular sequence of stages are provided for purposes of illustration. Further, different stages may occur at the same time or in different sequences.

Figure 3:
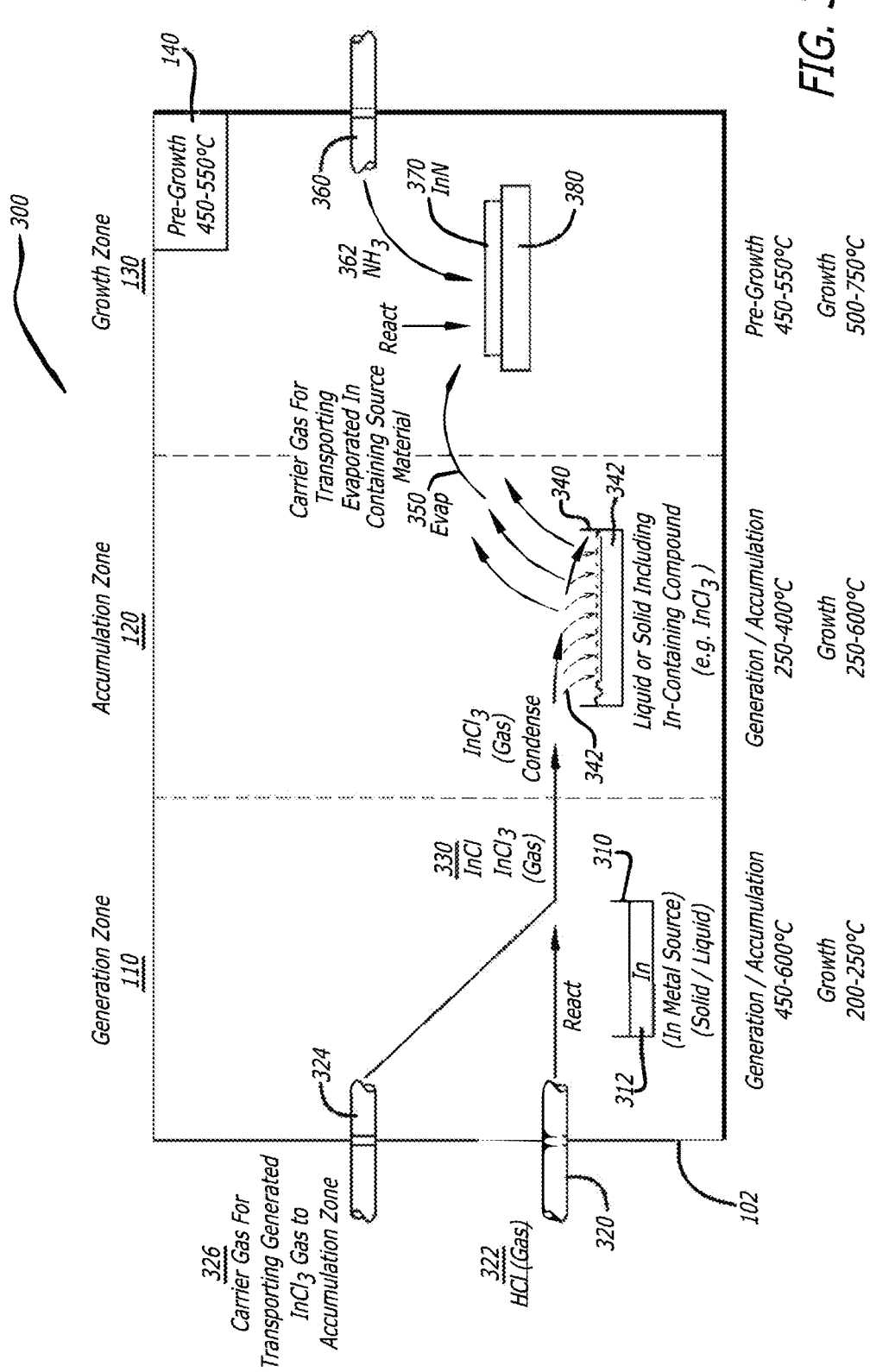
FIG. 3 is a system flow diagram illustrating a HVPE apparatus configured for generating and accumulating an indium source material inside the reactor and growing an indium-containing nitride material inside the reactor according to one embodiment.

FIG. 3 is a system flow diagram of a HVPE growth apparatus 300 according to one embodiment and further illustrates how an indium-containing source material for growth of high quality indium nitride is generated inside the growth apparatus 300 using a gas product that is vapor or a gas resulting from evaporation of a liquid/solid source material having one or more indium-containing compounds and formed inside the apparatus 300. A HVPE growth apparatus 300 according to one embodiment includes a generation zone 110, an accumulation zone 120 and a growth zone 130. A pre-growth zone 140 may be used to pre-heat or pre-treat substrates 380 before indium nitride 370 is grown on the substrate 380. One or more indium source boats or containers 310 (one boat 310 is shown in FIG. 3) located inside the generation zone 110 hold a source 312 of indium, such as solid or liquid indium metal. A suitable indium boat 310 can, for example, have a volume of about 20 to 50 cm$^3$. Although FIG. 3 illustrates one indium boat 310, embodiments can be implemented using multiple indium boats 310, e.g., for simultaneous growth of different indium nitride layers on different substrates.

The HVPE growth apparatus 300 also includes various inlet or sources, channels, tubes or other suitable conduits (generally referred to as a "source" or "source tube") for introducing gases into the growth apparatus 300 for use during generation and accumulation an indium source material and growth of indium nitride. In the illustrated embodiment, one or more sources 320 (one source tube 320 is illustrated) extend through a wall 102 of the apparatus 300 and provide a first reactive gas 322 into the generation zone 110. According to one embodiment, the first reactive gas 322 is HCl gas.

The apparatus 300 also includes one or more other sources 324 (one source tube 324 is illustrated) that extends through a wall 102 of the apparatus 300 and into the generation zone 110 for providing an inert gas 326 into the generation zone 110. According to one embodiment, the inert gas 326 is Argon gas.

During use, the first reactive gas or HCl gas 322 is provided from the source 320 and into the generation zone 110. The first reactive gas 322 passes over and reacts with the solid or liquid indium metal 312 held in the indium boat 310 to form a first gas product 330. The first gas product 330 includes an indium-containing compound, such as InCl, $InCl_2$ and/or $InCl_3$, in gaseous form. This specification refers to $InCl_3$ for purposes of explanation; however, persons skilled in the art will recognize that the reaction between the first reactive gas 322 and the indium source 312 may result in other indium-containing compounds. The inert gas 326 is introduced into the generation zone 110 to transport the first gas product 330 containing one or more indium-containing compounds from the generation zone 110 to the accumulation zone 120.

In alternative embodiments, first reactive gases 322 other than HCl gas can be utilized, such as bromine and other halogens or halogen hydrides. Thus, following the reaction of the first reactive gas 322 and the indium source 312, the first gas product 330 can include various species containing halogen and indium components including InI, InCl, $InCl_2$, $InCl_3$, InBr, $InBr_2$, $InBr_3$, InF, $InF_2$ and/or $InF_3$ depending on the type of first reactive gas 322 that is utilized and the result of the reaction of the first reactive gas 322 and the indium source 312. For purposes of explanation, reference is made to a first reactive gas 322 that is HCl, and a first gas product 330 resulting from reaction of HCl 322 and an indium source material 312.

As discussed with respect to the configuration of the growth apparatus 100, source tubes can have a cylindrical cross-section and other shapes and sizes. Further, a source tube is generally illustrated as extending through a wall 102 of the apparatus 300 to provide a gas. In practice, however, a source tube may extend to a different location than the location as illustrated since FIG. 3 generally illustrates a source tube providing a gas, and additional sections of source tubes inside the apparatus 300 are omitted for clarity. Thus, persons skilled in the art will appreciate that source tubes can extend to different areas inside the apparatus 300 and be configured or positioned as necessary to achieve a desired gas flow in a particular direction.

The first gas product 330 is transported from the generation zone 110 to the accumulation zone 120, e.g., by a carrier gas 326. One example of a suitable carrier gas 326 is argon gas. Other suitable gases and gas mixtures may also be utilized. The temperature of the accumulation zone 120 is lower than the temperature in the generation zone 110 so that the first gas product 330 condenses from a gas into a liquid and/or solid condensate 342 (referred to as "condensate," "liquid/solid" or "source material") that includes one or more indium-containing compounds as the first gas product 330 enters the accumulation zone 120 or while the first gas product 330 is within the accumulation zone 120. The condensate or source material 342 is collected in a container or vessel 340 located in the accumulation zone 120. The vessel 340 can, for example, be quartz or sapphire and have a volume of about 1 to 100 cm$^3$. Other vessels 340 and vessel sizes can be utilized depending on the amount of liquid/solid source material 342 to be collected.

The vessel 340 holding the source material 342 can be fixed in a particular position or controllably moveable within the apparatus 300. For example, the vessel 340 can be moveable to different locations within the accumulation zone 120 in order to position the source material 342 in a particular location to achieve desired growth of indium nitride 370 in the growth zone 130.

When indium nitride 370 is to be grown, the temperature of the accumulation zone 120 and the temperature of the vessel 340 can be increased so that vapor and/or gas from the liquid/solid or source material 342, e.g., due to evaporation, forms a second gas product 350 that includes one or more indium-containing compounds. The second gas product 350 is transported by the carrier gas 326 from the accumulation zone 120 and into the growth zone 130. In the growth zone 130, indium in the second gas product 350 reacts with a second reactive gas 362. The second reactive gas 362 includes ammonia and is introduced into the growth zone 130 through one or more sources or channels 360 (one source tube 360 is illustrated) by a carrier gas, such as argon. The indium in the second gas product 350 and the ammonia in the second reactive gas 362 react, thereby resulting in growth of indium nitride 370 on a substrate 380 in the growth zone 130.

Figure 4:
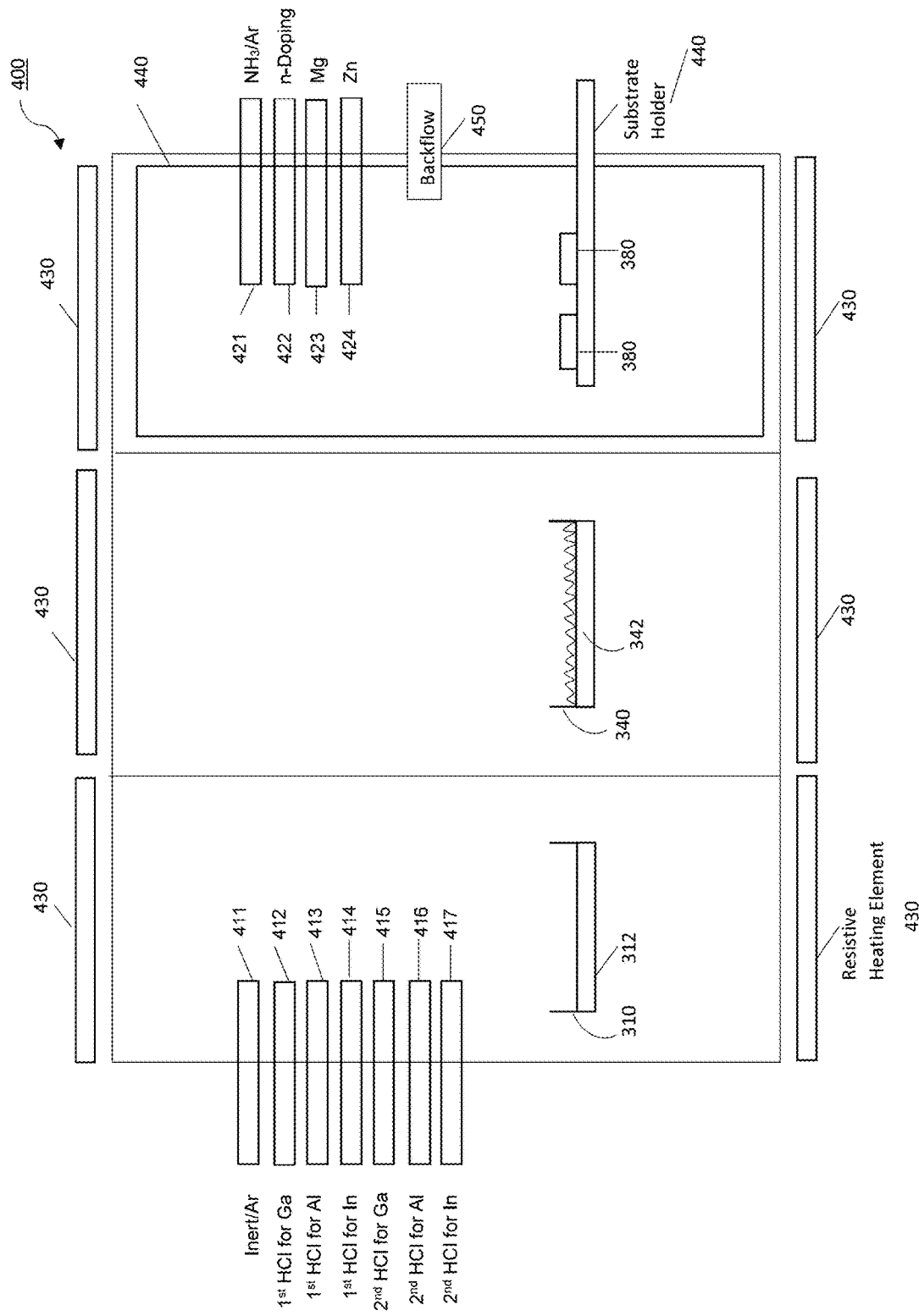
FIG. 4 illustrates a configuration of a HVPE apparatus for use with various embodiments.
Figure 5:
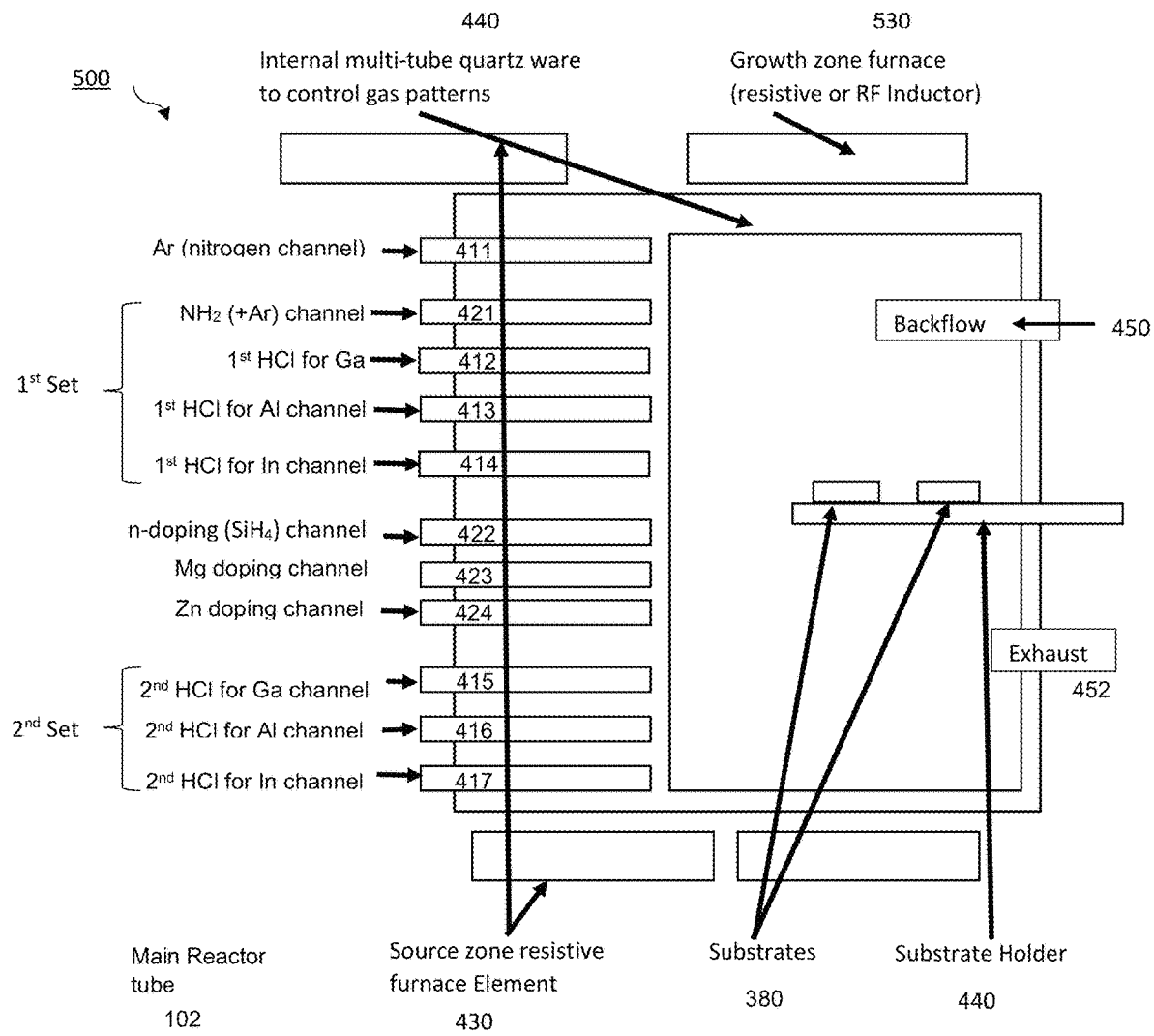
FIG. 5 illustrates another configuration of a HVPE apparatus for use with various embodiments.

Various types and sizes of substrates 380 can be used with embodiments. For example, the substrate 380 can be two inches, four inches, six inches and other sizes as needed. Further, the substrate 380 can be composed of various materials, e.g., sapphire, aluminum, InN, SiC, Si, GaN, AlN, AlGaN, GaAs. The substrate 380 can also be an engineered substrate or template, such as InN/GaN-on-sapphire, GaN-on-sapphire, AlN-on-sapphire, GaN-on-SiC and AlGaN-on-Si and other suitable engineered substrates. Thus, references to a sapphire substrate 380 are provided as one example of one suitable substrate 380. The surface of the substrate 380 may have exact crystallographic orientation, for example (0001) on-axis. Embodiments can also be implemented using off-axis substrates 380 with a tilt angle ranging from 0 to 90 degrees. The crystallographic direction of the tilt angle may be [11-20] and other directions as needed FIGS. 4 and 5 illustrate example growth apparatus 400 and 500 (generally apparatus 400) configurations that can be used to grow indium nitride 370. Apparatus and method embodiments allow InN growth rates to be controlled from a fraction of a micron per hour to more than 10 microns per hour. In the illustrated example, a number of sources, channels or tubes extend through a wall or main tube 102 of the apparatus 400. For example, source tubes can extend through different sides 102 of the apparatus 400 (as shown in FIG. 4) or through one side 102 of the apparatus 400 (as shown in FIG. 5). With reference to FIG. 5, the source tubes can extend through one side of the apparatus 500 and have a suitable length so that the gas provided by the source tube is delivered to the appropriate zone inside the apparatus 500.

Further, persons skilled in the art will appreciate that a single source, channel or tube can supply a gas to multiple zones inside the reactor. For example, source tube 411 can supply an insert gas to all three zones 110, 120 and 130. Alternatively, multiple source tubes can be used to supply an insert gas 326 to one or multiple zones. FIGS. 4 and 5 illustrate a horizontal apparatus configuration, but embodiments can also be implemented in a vertical configuration. Thus, embodiments can be implemented using various HVPE growth apparatus configurations.

As shown in FIGS. 4 and 5, channels or sources provide different chemical elements or compounds for growth. In the illustrated embodiment, source or channel 411 can be the source tube 324 that supplies a carrier gas 326, such as Argon, into the generation zone 110, the accumulation zone 120 and/or the growth zone 130 of the growth apparatus 400. If the growth apparatus 400 will be used for growth of a gallium-containing material, a source or channel 412 can be provided to supply a first reactive gas 322, such as HCl gas, for reaction with a gallium source for growth of a gallium-containing material. If the growth apparatus 400 will be used for growth of an aluminum containing material, a source or channel 413 is provided to supply a first reactive gas 322, such as HCl gas, for reaction with an aluminum source for growth of an aluminum-containing material. An indium source or channel 412 represents the generation zone 110 and the accumulation zone 120 as shown in FIG. 3. More particularly, the indium source or channel 412 represents the first reactive gas 322, such as HCl gas 322, which reacts with an indium source 312 in the generation zone 110 to form a first gas product 330, which condenses into the source material 342, which is collected in the accumulation zone 120.

Sources 411-414 can be used to grow one or more layers 370 on a substrate 380. Additional sets of source, e.g., a second set of sources 415-417, can be used to grow additional materials or structures as needed. As discussed above, the indium source or channel 417 represents the generation zone 110 and the accumulation zone 120 as shown in FIG. 3. The growth apparatus 400 also includes a source or channel 421 for supplying a second reactive gas 362, such as a gas that includes ammonia and an argon carrier gas, into the growth zone 130 for growth of indium nitride 370. Sources or channels 422-424 can be used to introduce various dopants, such as SiH4 for n-type doping, and magnesium and zinc for p-type doping, into the growth zone 130. An internal multi-tube quartz ware (substrate holder) 440 is used to control the gas patterns from the source tubes in the growth zone 130. The shape of the quartz ware (substrate holder) 440 allows formation of laminar gas flows to prevent inconsistent growth rates and material properties.

Referring to FIG. 5, the outer surfaces of the outer wall or main tube 102 of the growth apparatus 500 are at least partially covered by resistive heating elements 430 that provide the desired temperature profiles inside the apparatus 500 and define corresponding generation, accumulating and growth zones 110, 120 and 130. Further, different portions of the apparatus 500 can be heated by different methods. For example, a substrate 380 can be heated using RF heating, whereas a portion of a generation zone 110 may be resistively heated.

In the illustrated apparatus 500, two sets of sources or channels are used for simultaneous growth on two substrates 380 in the growth zone 130. Two substrates 380 are supported by a substrate holder 440. Although FIGS. 4 and 5 illustrate two substrates 380 for simultaneous growth of indium nitride materials, other numbers of substrates 380 can be supported for simultaneous growth of various numbers of indium nitride layers or structures. Further, the substrates can be positioned horizontally, vertically, or at an angle with respect to gas flows.

For example a substrate holder 440 may support one, two, ten twenty or other numbers of substrates 380 for simultaneous growth of indium nitride materials on different substrates 380. Embodiments can be utilized to grow one indium nitride layer or structure, or multiple substrates for simultaneous growth of multiple layers or structures at the same time. Further, embodiments can be used to grow only indium nitride, or indium nitride in combination with other materials, such as gallium and aluminum containing materials. Backflow source 450 provides gas to adjust the pressure inside the growth zone 130, and after growth, the waste materials can be removed via exhaust line 452. Persons skilled in the art will appreciate that the arrangement of source tubes can vary, and that FIGS. 4 and 5 are provided for purposes of illustration.

According to one embodiment, a growth apparatus has a total length of about 2000 mm and a diameter of about 80 mm (in the case of a cylindrical reactor). In one implementation, the length of the generation zone 110 is about 250 mm, the length of the accumulation zone 120 is about 150 mm, and the length of the growth zone 130 is about 200 mm. The distance between the indium boat 310 and the collection vessel 340 is about 300 mm. The distance between the collection vessel 340 and a substrate 380 is about 400 mm. Persons skilled in the art will appreciate that various apparatus configurations can be utilized depending on, for example, the amount of gas flows, temperatures in each of the zones 110, 120 and 130, the quantity of the indium source 312, the size of the indium boat 310, the size of the vessel 340, the amount of source material 342 to be collected, the number of substrates 380 and/or the type of material to be grown. Accordingly, the dimensions and spacing of apparatus components are provided to describe one example of a growth apparatus configuration, and other component dimensions and locations can be utilized.

FIG. 6 illustrates in further detail a method 600 of growing indium nitride using HVPE reactor embodiments. The method 600 includes loading an indium source material, such as solid or liquid indium metal, into an indium source boat or container positioned inside the generation zone at stage 602. At stage 604, the HVPE apparatus is flushed and filled with an inert gas, e.g., an argon gas. At stage 606, the indium metal source is heated, e.g., melted, by controlling resistive heaters that extend at least partially around the portion of the reactor that is the generation zone. At stage 608, a first reactive gas, such as HCl gas, is introduced into an indium source tube and into the generation zone. At stage 610, indium metal and the first reactive gas react to form a first gas product. The first gas product includes one or more indium-containing compounds, one of which may be $InCl_3$. At stage 612, the first gas product is transported from the generation zone to the accumulation zone using a carrier gas. At stage 614, the first gas product is cooled so that it condenses form a gas in the generation zone into a liquid or solid in the accumulation zone as a result of the temperature difference between the generation and accumulation zones. At stage 616, the resulting liquid/solid source material that includes one or more indium-containing compounds is collected in a vessel located in the accumulation zone. At stage 618, the flow of the first reactive gas (HCl) into the generation zone is stopped, and at stage 620, the indium metal source in the generation zone is cooled.

At stage 622, if necessary, one or more substrates upon which indium nitride will be grown are introduced into a pre-growth zone into the reactor and pre-heated. The substrates may be pre-heated to prevent thermal shock when they are introduced into the growth zone. At stage 624, if a pre-growth zone is utilized, the one or more substrates are moved from the pre-growth zone into the growth zone. At stage 626, the substrates can be treated in the growth zone prior to growth, e.g. by exposure to a gas that includes a mixture of ammonia, HCl and an indium-containing gas, such as indium chlorides. The pre-treatment may be useful to improve the structural quality of the indium nitride layers that are grown. For example, optional pre-treatment in the growth zone may involve cleaning the substrate, modifying the substrate surface (e.g., changing the structure of surface bonds).

At stage 628, the flow of HCl gas into the growth zone for pre-treatment of the substrate is stopped, and at stage 630, the temperature of the source material that has one or more indium-containing compounds in the accumulation zone is adjusted if necessary. At stage 632, vapor or gas from the liquid/solid source material, e.g., due to evaporation, forms a second gas product. At stage 634, the second gas product having one or more indium-containing compounds is transported by a carrier gas from the accumulation zone to the growth zone, e.g., by passing the carrier gas over the collection vessel. At stage 636, a second reactive gas (e.g., ammonia) is introduced into the growth zone. At stage 638, the ammonia of the second reactive gas and the indium in the second gas product react, resulting in growth of indium nitride on the substrate at stage 640. At stage 642, the growth zone and grown indium nitride crystals or layers are cooled and unloaded. At stage 644, active gas flows are stopped, and at stage 646, the substrates are moved into a cool down zone.

With HVPE apparatus and fabrication method embodiments, growth of indium nitride is advantageously performed in the absence of HCl gas flow in the growth zone 130. For example, as discussed above with reference to FIG. 6, HCl gas is introduced into the generation zone 110, but flow of HCl gas is stopped and is not introduced into the growth zone 130. HCl gas is used to pre-treat the substrate in the growth zone 130, but flow of HCl gas in the grow zone 130 is stopped before growth of indium nitride. Thus, embodiments provide improvements over known methods by eliminating the need for HCl gas during growth of indium nitride, which is beneficial because HCl gas etches off growing indium nitride materials.

Persons skilled in the art will appreciate that the method illustrated in FIG. 6 and the particular sequence of steps are provided for purposes of illustration. Further, different steps may occur at the same time or in different sequences. For example, certain steps may be performed in the generation zone 110 and in the accumulation zone 120 at the same time. Further, certain steps may be performed in the accumulation zone 120 and in the growth zone 130 at the same time.

Figure 7:
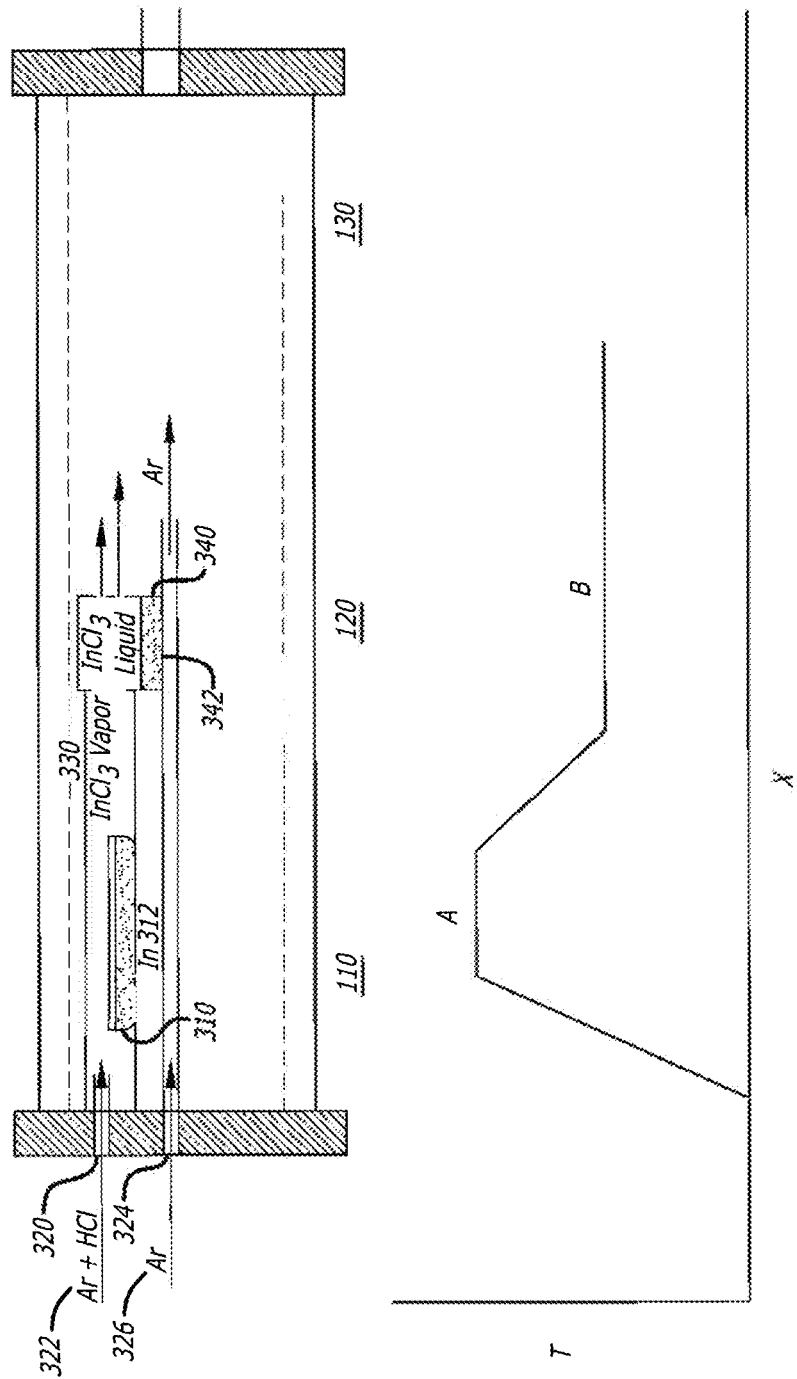
FIG. 7 illustrates generation and collection zones inside a HVPE apparatus and corresponding relative temperatures during generation and accumulation of an indium-containing liquid according to one embodiment.
Figure 8:
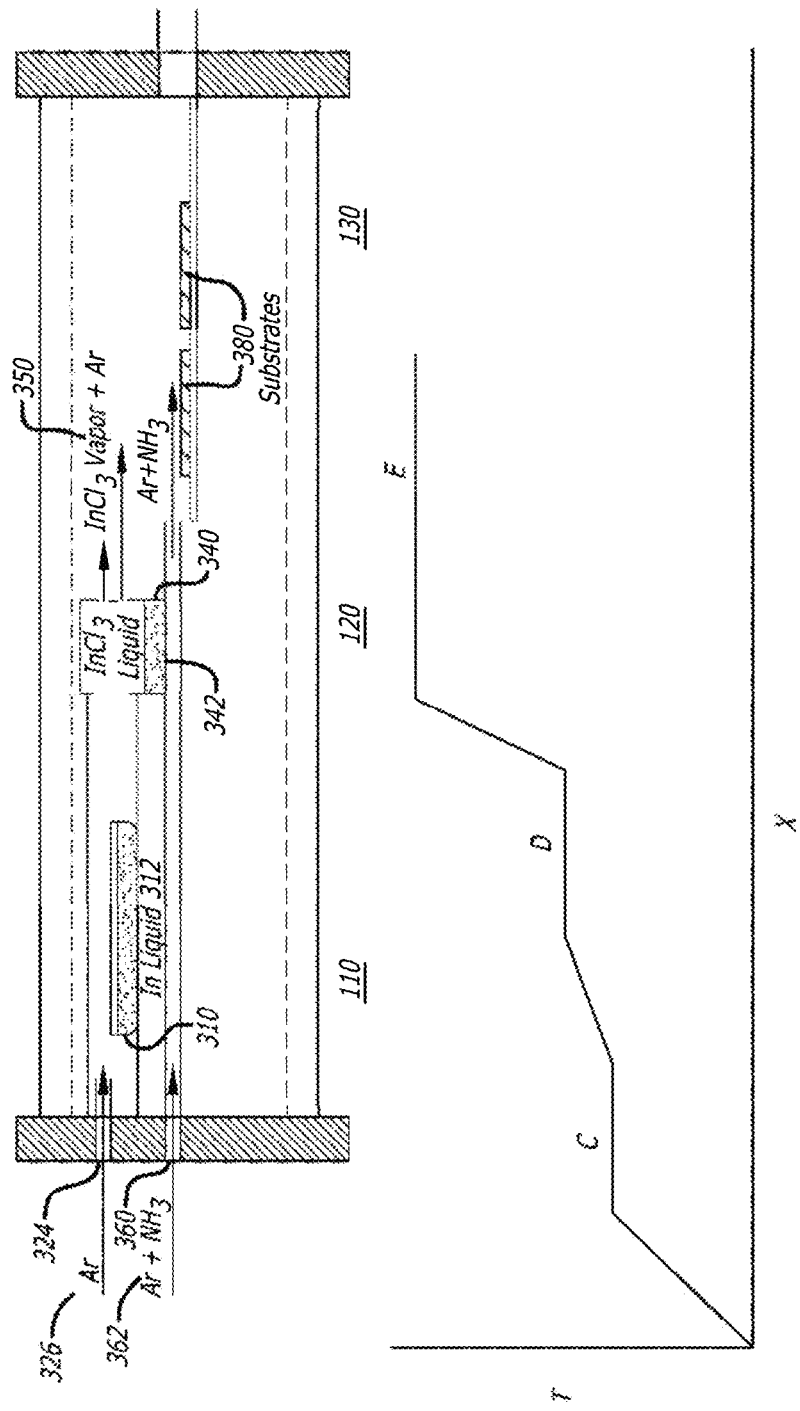
FIG. 8 illustrates generation, accumulation and growth zones inside a HVPE apparatus and corresponding relative temperatures during growth of indium nitride according to one embodiment.

FIGS. 7 and 8 generally illustrate sections of a HVPE reactor and relative temperatures in different zones of the reactor according to embodiments. FIG. 7 illustrates relative temperatures during generation and accumulation of source material 342, and FIG. 8 illustrates relative temperatures during growth of indium nitride after the generation and accumulation stages. In FIGS. 7 and 8, "x" generally represents a location in the reactor, and "T" generally represents a temperature at the "x" location.

Referring to FIG. 7, during generation and accumulation stages, a first reactive gas 322, e.g., HCl gas, is introduced into the generation zone 110 to react with indium source metal 312. The indium boat 310 in the generation zone 110 can contain about 100-300 grams of indium source metal 312, and the flow of the first reactive gas 322 can be about 0.5-3.0 liters per minute over the indium source metal 312. The first reactive gas 322 and the indium source metal 312 react for a duration of about 25-180 minutes, and the temperature inside the generation zone 110 (temperature "A") is sufficiently high to heat/melt the indium metal 312, e.g., about 450-600° C. during the generation stage.

The result of the reaction of the first reactive gas 322 and melted indium metal 312 is a first gas product 330 that includes one or more indium-containing compounds, such as $InCl_3$. The first gas product 330 is transported from the generation zone 110 to the accumulation zone 120 by a carrier gas 326. The flow rate of the carrier gas 326 can be about 0.1-2.5 liters per minute. The temperature of the first gas product 330 is reduced so that it condenses from a gas into source material 342, which is collected in the vessel 340 in the accumulation zone 120.

During generation/accumulation of an indium source material in the vessel 340, the temperature in the accumulation zone 120 is temperature "B," which is less than temperature "A" in the generation zone 110. Although not illustrated in FIG. 7, temperature in the growth zone 130 (and in the pre-growth zone 140 if utilized) during generation and accumulation of the source material indium source material 342 is higher than the temperature B in the accumulation zone 120.

For example, the temperature in the accumulation zone 120 and the temperature of the collection vessel 340 during generation/accumulation can be maintained at a temperature "B" of about 250-400° C. to ensure that the first gas product 330 condenses into a source material 342. The duration of the source material 342 accumulation can vary depending on the quantity of indium source material required. For example, the source material 342 can be collected for about 20 minutes to 3 hours, and the amount of collected source material 342 can be about 200 ml. More or less source material 342 can be collected depending on fabrication needs. For example, more source material 342 may be required if multiple indium nitride materials or layers are grown simultaneously. The reaction between the first reactive gas 322 and the indium metal 312 in the generation zone 110 and the accumulation of the source material 342 in the accumulation zone 120 can occur simultaneously as the first reactive gas 322 reacts with indium metal 312 and the resulting first gas product 330 is condensed into a source material 342 in the accumulation zone 120. The vessel 340 and the accumulation zone 120 can be adjusted to optimize the efficiency of collecting the source material 342.

Referring to FIG. 8, the temperatures in the generation and accumulation zones 110 and 120 are adjusted to switch from generation of the first gas product 330 and accumulation of the liquid/solid source material 342 to growth of indium nitride 370 using the collected source material 342. For growth of indium nitride 370, the temperature in the generation zone 110 and the temperature of the indium source boat 310 is reduced from temperature A of about 450-600° C. to temperature "C" of about 200-2500C. Reducing the temperature of the indium source 312 prevents free indium evaporation during the growth stage and also prevents indium droplets from incorporating into indium nitride crystals 370 grown in the growth zone 130. Thus, reducing the temperature of the generation zone 110 advantageously avoids indium metal inclusions in grown indium nitride materials 370.

Additionally, the temperature of the accumulation zone 120 and the vessel 340 holding the collected source material 342 may be increased from temperature B of about 250-400° C. to temperature D. For example, temperature D can be greater than 250° C. to about 600° C. The temperature in the pre-growth zone 140 (if utilized) can be maintained at about 450-550° C. After heating the substrates 380 in the pre-growth zone 140 (if utilized), the substrates 380 are moved into the growth zone 130 and pre-treated with a gas mixture of ammonia, HCl, and a gas having an indium-containing compound. During pre-treatment, the temperature in the growth zone 130 can be about the same as during the growth stage, the duration of the pre-treatment can be about 10 to 30 minutes, and the flow of the gas used for pre-treatment can be about 1-10 liters/minute.

The pre-treated substrates 380 are maintained in the growth zone 130 at temperature E of about 500-750° C. To initiate the growth, a second reactive gas 362 including ammonia and argon and the second gas product 350 are introduced into the growth zone 130. The flow of the second reactive gas 362 can be about 1 to 20 liters/minute, and the flow of the carrier gas transporting the second gas product 350 can be about 0.1 to 10 liters/minute. Thus, embodiments advantageously eliminate HCl gas from the growth zone 130 and grow high quality, low defect density indium nitride materials 370.

Figure 9:
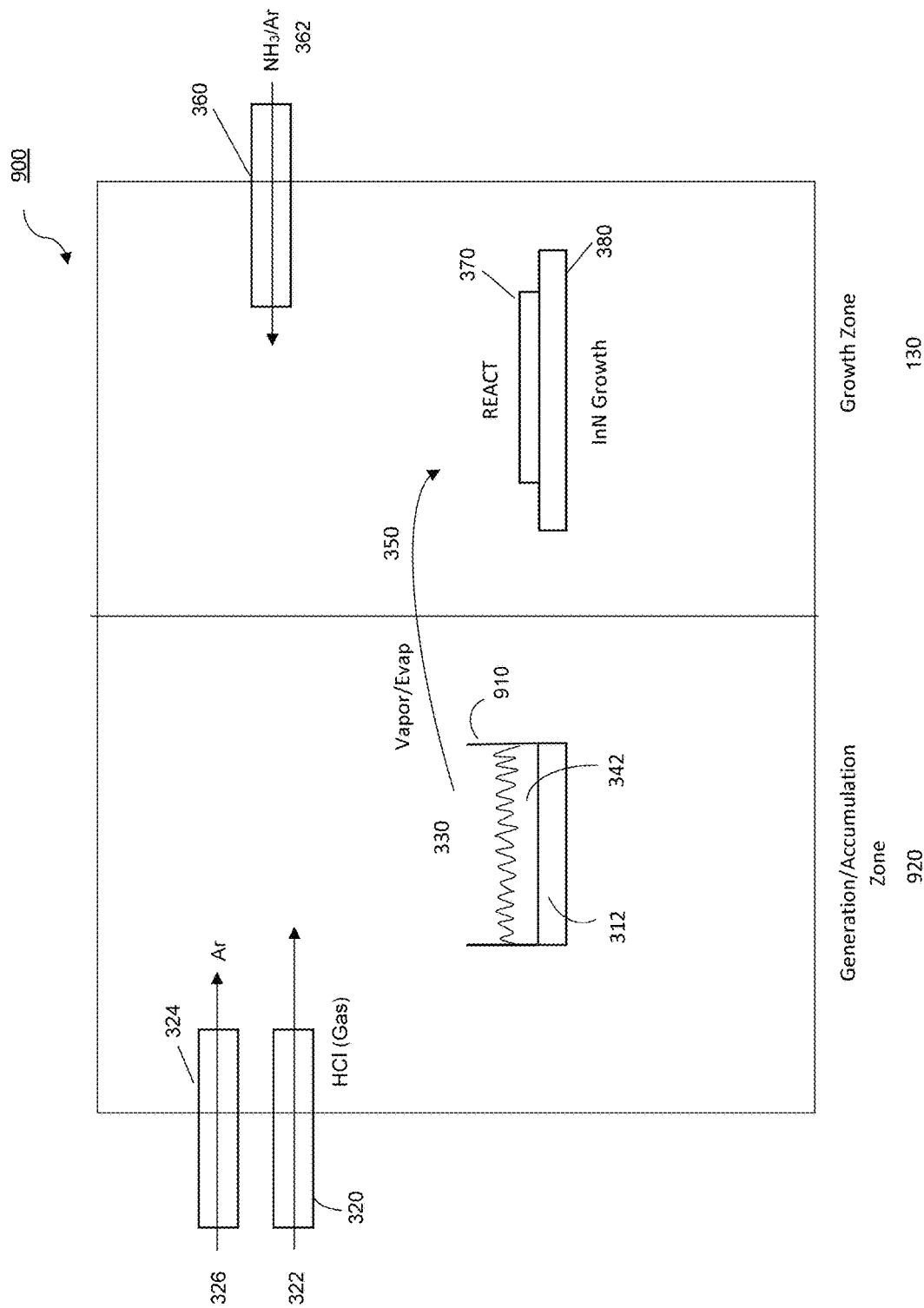
FIG. 9 is a system flow diagram illustrating a HVPE apparatus having a combination generation/accumulation zone according to another embodiment.

FIG. 9 is a system flow diagram of a HVPE reactor 900 according to another embodiment in which a single vessel or container 910 that holds an indium source metal 312 and, in addition, collects indium-containing liquid 342 resulting from condensation of vapor or a first gas product 330 derived from the indium source 312. Thus, in the illustrated embodiment, the apparatus 900 includes two zones—a combination generation/accumulation zone 920 and a growth zone 130. Otherwise, the embodiment shown in FIG. 9 operates in a similar manner as the embodiments described above except that a first reactive gas 322, such as HCl gas, reacts with an indium metal source 312 held in the vessel 910. This reaction results in a first gas product 330 (shown above the vessel 910). The first gas product 330 condenses and is collected as a liquid source material 342 in the same vessel 910 as a result of the temperature inside the generation/accumulation zone 920. In the illustrated embodiment, liquid indium chloride completely covers the top surface of the indium metal source in the vessel 910. Thus, the embodiment shown in FIG. 9 eliminates the need to carry the first gas product 330 to the accumulation zone 120 and the need for a vessel 340.

When indium nitride 370 is to be grown in the reactor 900, the temperature of the generation/accumulation zone 920 can be increased so that a second gas product 350 is formed from vapor or gas resulting from evaporation of the collected source material 342. The second gas product 350 is transported by a carrier gas into the growth zone 130. In the growth zone 130, the second gas product 350 that includes an indium-containing compound reacts with ammonia in the second reactive gas 362 resulting in growth of indium nitride 370 on a substrate 380 in the growth zone 130.

Figure 10:
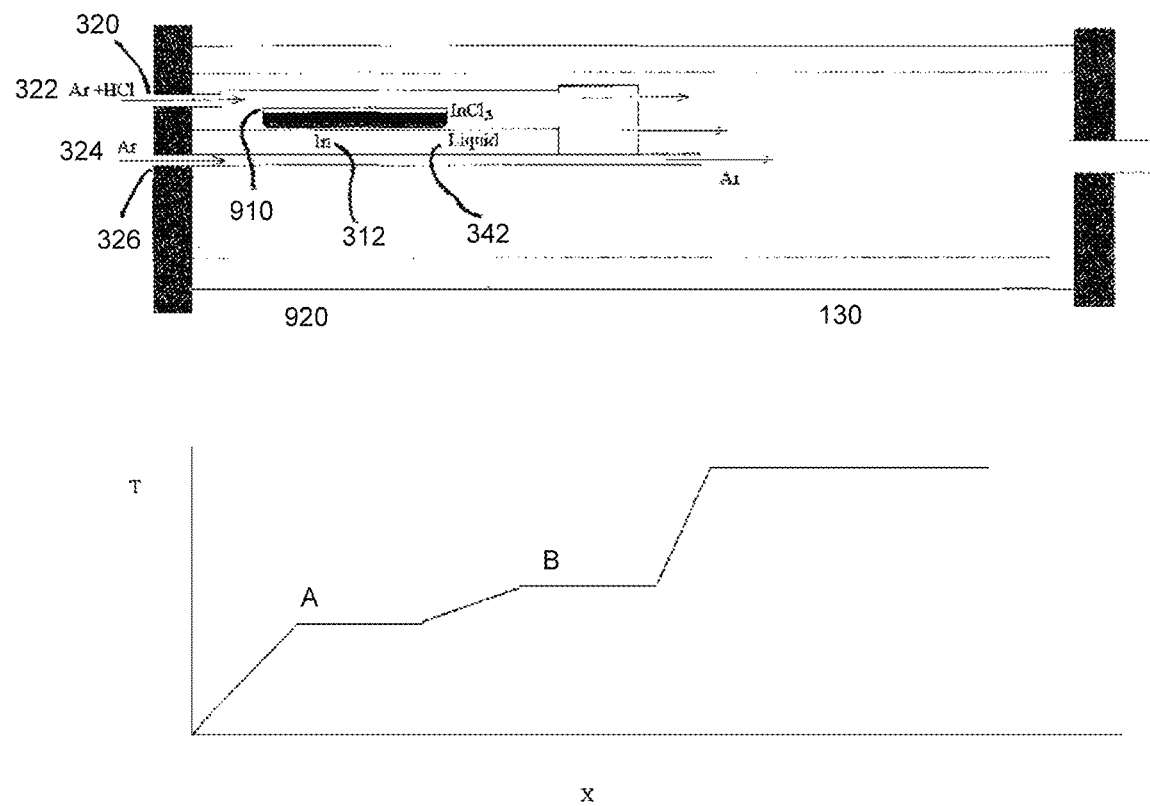
FIG. 10 illustrates a combination generation/accumulation zone inside a HYPE apparatus and corresponding relative temperatures during generation/accumulation stages according to one embodiment.
Figure 11:
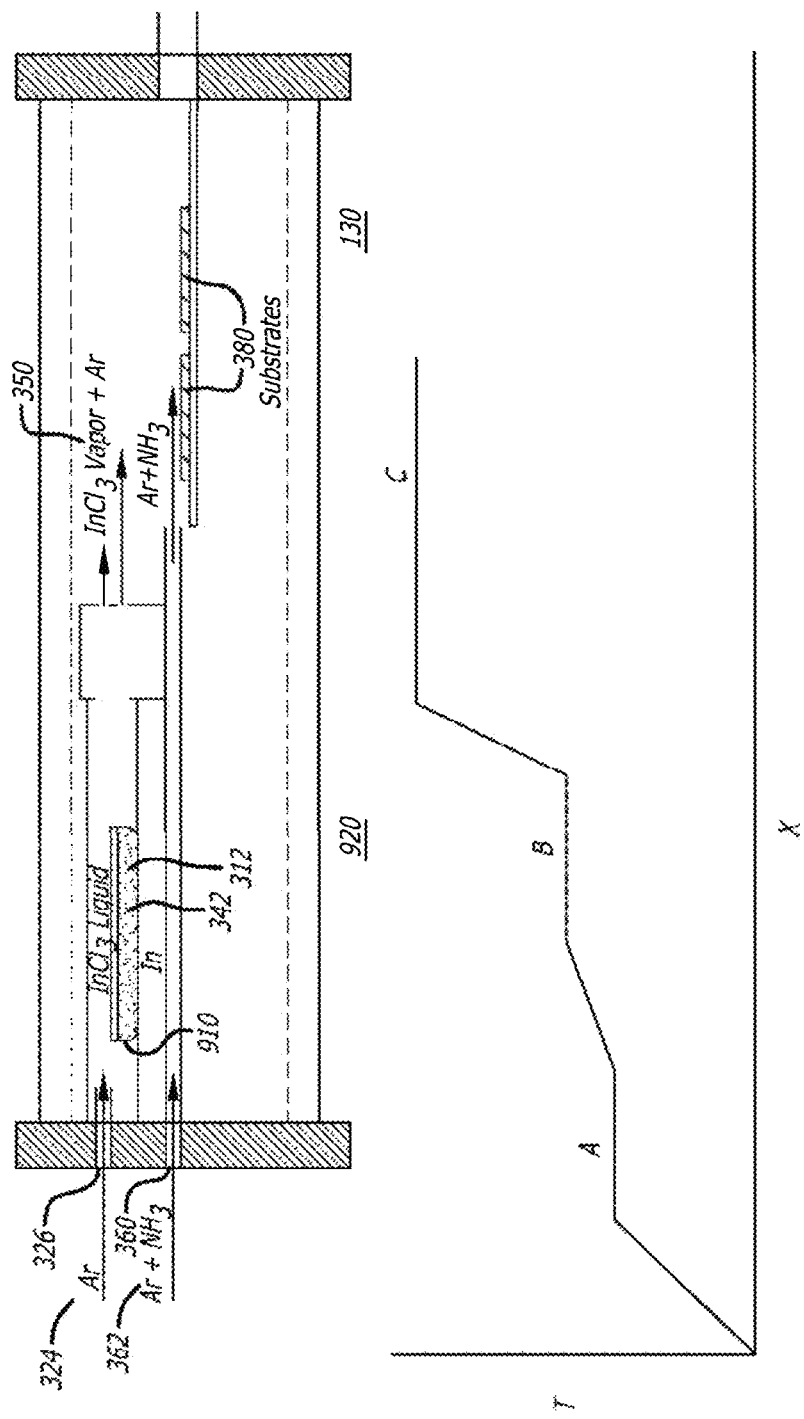
FIG. 11 illustrates a combination generation/accumulation and growth zones inside a HVPE apparatus and corresponding relative temperatures during growth of indium-containing nitride materials according to one embodiment.

FIGS. 10 and 11 illustrate sections of the HVPE reactor 900 and relative temperatures in different zones of the reactor 900. FIG. 10 illustrates relative temperatures during generation and accumulation of an indium source material in the form of the liquid 342, and FIG. 11 illustrates relative temperatures during growth of indium nitride 370 after the generation and accumulation stages. In FIGS. 10 and 11, "x" generally represents a location in the reactor 900, and "T" generally represents a temperature at the "x" location.

Referring to FIG. 10, during generation of a first gas product 330 and collection of an indium containing source material 342, a first reactive gas 322, e.g., HCl gas, is introduced into the generation/accumulation zone 920 to react with the indium source metal 312 held in the vessel 910. The vessel 910 can contain about 100-25 0 grams of indium source metal 312, and the flow of the first reactive gas 322 over the indium source 312 can be about 0.5-3.0 liters per minute. Temperature A is sufficiently high to heat and melt the indium metal 312, but is also at a level so that liquid 342 is collected in the same vessel 910. The evaporation rate is sufficiently low so that a suitable amount of liquid 342 can be accumulated in the generation/accumulation zone 920. For example, temperature A can be about 250-400° C., and the duration of generation/accumulation can be about 25-180 minutes.

The second gas product 350 resulting from evaporation of the collected liquid 342 is carried by a carrier gas 326, and heated from temperature A to temperature B, which can be from about 300-600° C. The second gas product is heated from temperature A to temperature B to adjust the temperature of gas components to temperatures suitable for growth of indium nitride 370.

Referring to FIG. 11, for growth of indium nitride 370, the second gas product 350 is carried into the growth zone 130. As discussed above with reference to FIG. 8, one or more substrates 380 may be initially placed in a pre-growth zone 140, which is maintained at a temperature of about 450-550° C., and moved into the growth zone 130 for pre-treatment and growth of indium nitride 370 using the second gas product 350 while the growth zone 130 is at a temperature of about 500-750° C. It should be understood that specific timing, temperature and gas flow parameters and reactor configurations and dimensions can be changed to vary growth of indium nitride 370.

HVPE reactor and method embodiments can be used to grow various indium nitride materials, including single indium nitride layers, multiple indium nitride layers, epitaxial structures having one or more indium nitride layers and one or more other group III-V layers, indium nitride micro-structures, and indium nitride nano-structures. Growth can occur on various substrates and III-V/substrate templates. Indium nitride material, epitaxial layer and structure embodiments that can be grown with HVPE apparatus and method embodiments are described in further detail below.

Growth of Indium Nitride on Substrate by HVPE

Figure 12:
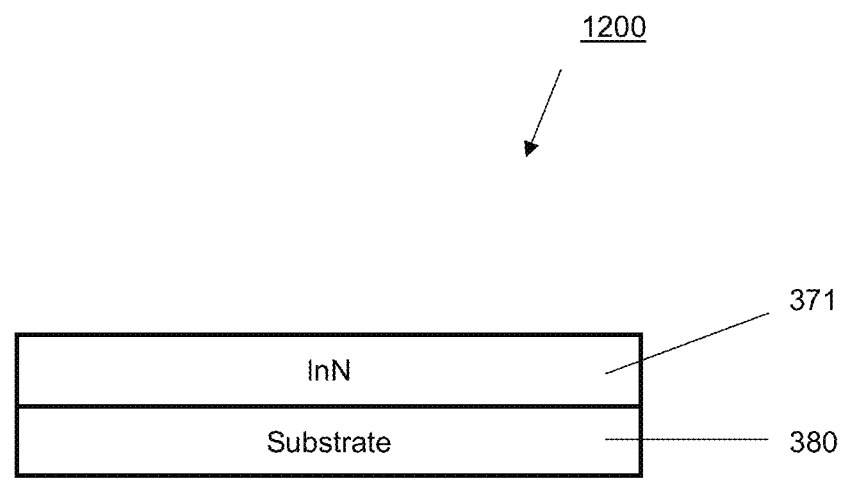
FIG. 12 illustrates an epitaxial structure including an indium nitride layer grown on a substrate.

Referring to FIG. 12, an epitaxial structure 1200 according to one embodiment that can be grown using HVPE reactor and method embodiments includes a low defect density indium nitride single crystal material or layer 371 on a substrate 380, such as a sapphire substrate, an AlGaN/sapphire substrate or an AlN/sapphire substrate. The indium nitride layer 371 is grown using an indium source material or second gas product 350 that is formed from vapor or gas resulting from evaporation of a liquid/solid source material 342 having one or more indium-containing compounds and that is generated and collected inside the HVPE reactor.

The improved quality of grown indium nitride layers 371 is demonstrated by x-ray, optical and other characterization data. Initially, the grown layers 371 had smooth mirror like surfaces. Additionally, the surface roughness of the layer 371, measured by atomic force microscopy (AFM), rms, ranged from 0.1 to 3 nm for a 5×5 micron AFM scan. The surface crystalline structure was studied by reflectance high energy electron diffraction (RHEED) and revealed a single crystalline surface. The RHEED image contained well defined Kikuchi lines and vertical rods indicating that the grown layer 371 is of high crystalline quality. InN structural characterization was also performed using x-ray diffraction methods.

Figure 23:
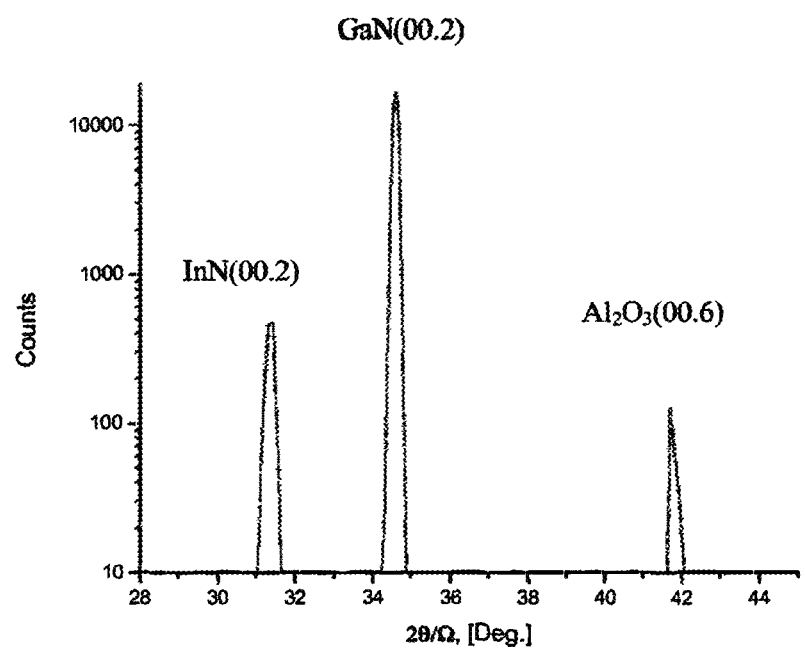
FIG. 23 is an XRD spectrum (ω/2Θ scan) for an indium nitride layer grown on a GaN/sapphire template at 550° C.
Figure 25:
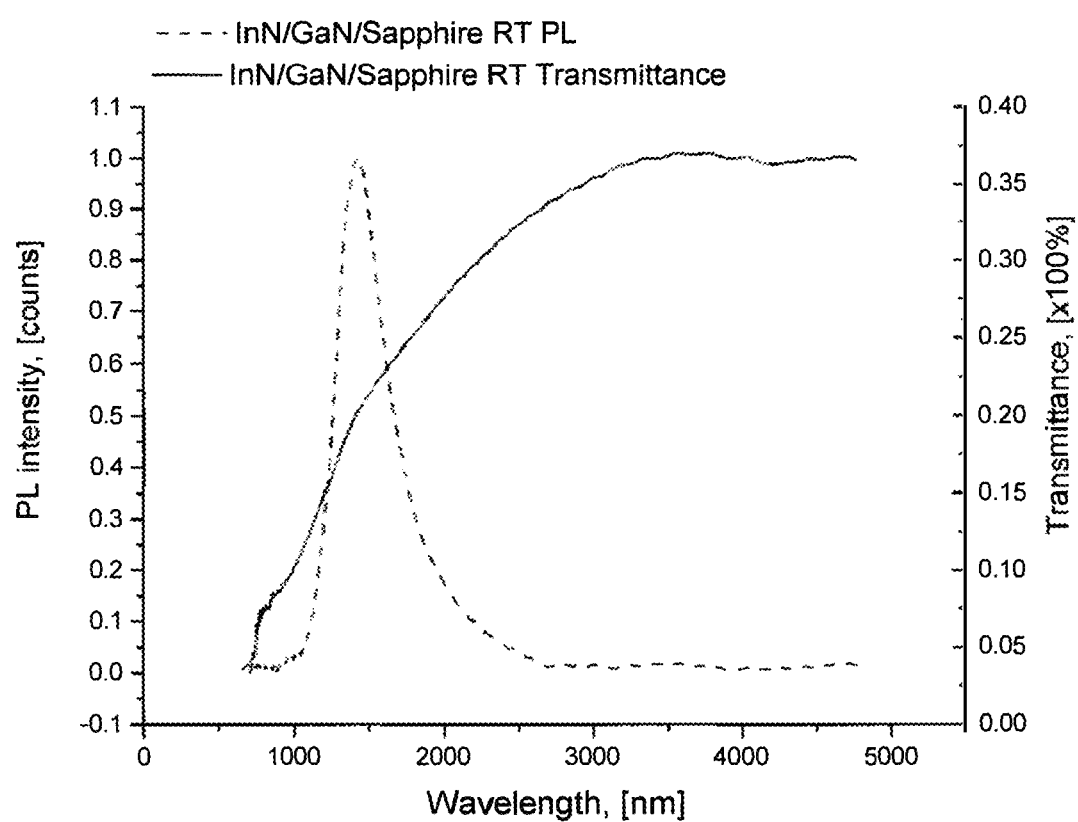
FIG. 25 shows room temperature PL and Transmittance spectra of a indium nitride layer grown on a GaN/sapphire template and having a carrier concentration of about $7 \times 10^{18}$ cm$^{-3}$.

X-ray measurements using 2Θ-ω scanning geometry showed the existence of a single crystalline InN layer grown on GaN/sapphire template substrates Three x-ray diffraction peaks from InN layer 371 and template substrate materials (GaN and sapphire) were presented in the scan (as shown in FIG. 23). The results of this analysis indicate that the grown materials 371 had no traces of In metal. X-ray rocking curve full width at half maximum (FWHM) was measured for the (00.2) and (10.2) InN reflections using ω-scanning geometry. Typical FWHM values were below 300 arc seconds and 1200 arc seconds, respectively. The narrowest rocking curves for InN layers grown on GaN have FWHM values below 80 arc seconds for □-2□scan. InN layers 371 grown on AlGaN/sapphire and AlN/sapphire substrates exhibit wider x-ray rocking curves from ~500 arc sec to 2700 arc seconds for the (00.2) reflections and from ~1000 to 2700 arc seconds for the (10.2) reflections. X-ray diffraction FWHM maps measured for entire 2-inch wafers gave standard deviations for the (00.2) and (10.2) reflections less than 10%. Grown InN layers 371 had n-type conductivity with electron concentration from $10^{17}$ to $10^{19}$ $cm^{-3}$. Electron mobility exceeds 200 $cm^2$/Vsec at room temperature. Electrical parameters uniformity for 2-inch wafer was better than 30%. For samples with carrier concentration of about $7 \times 10^{18}$ $cm^{-3}$, the optical absorption edge and photoluminescence peak position were around 0.85 eV (as shown in FIG. 25).

Further, with embodiments, HVPE can be used to grow high quality indium nitride material or layers 371 of various thicknesses. For example, the thickness of an indium nitride layer 371 that is grown on a substrate 380 can be from a fraction of nanometer to more than about 1 mm.

Embodiments also can be used to grow high quality, bulk indium nitride boules or boule-like structures. For example, the x,y,z dimensions of an indium nitride boule can each exceed about 0.2 centimeters. Thus, embodiments advantageously enable growth of high quality indium nitride layers 371 of various thicknesses and dimensions.

Growth of Multiple Indium Nitride Layers by HVPE

Figure 13:
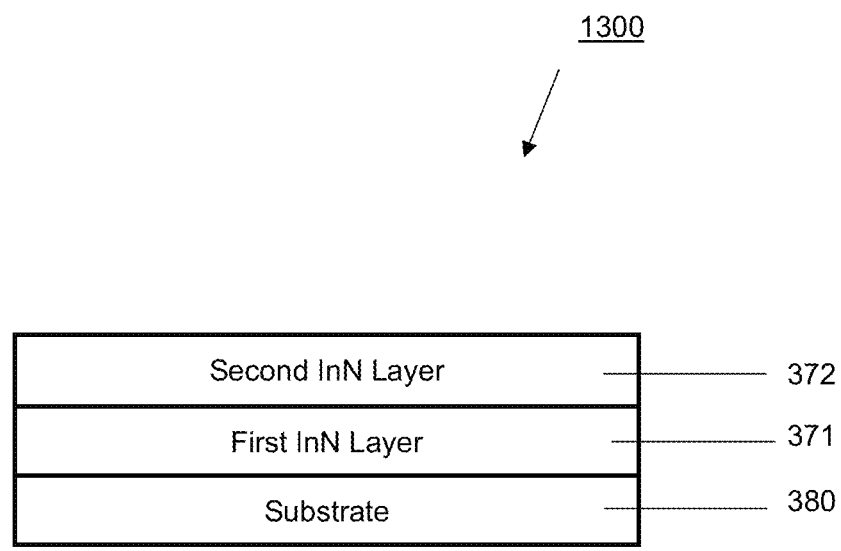
FIG. 13 illustrates an epitaxial structure including two different indium nitride layers according to one embodiment.

Referring to FIG. 13, an epitaxial structure 1300 according to one embodiment that can be grown using HVPE reactor and method embodiments includes multiple indium nitride layers on a substrate. In the illustrated embodiment, a first indium nitride layer 371 is grown on the substrate 380, and a second indium nitride layer 372 is grown directly on the first indium nitride layer 371. The first and second indium layers 371 and 372 can be grown in the same HVPE reactor during the same epitaxial run. According to one embodiment, the first and second layers 371 and 372 are different from each other. For example, the first and second indium nitride layers 371 and 372 can have different optical properties, different electrical properties, e.g., different conductivities and/or different physical properties, e.g., different thicknesses. One or both of the indium nitride layers 371 and 372 can have parameters described above with respect to a single InN layer 371.

Figure 14:
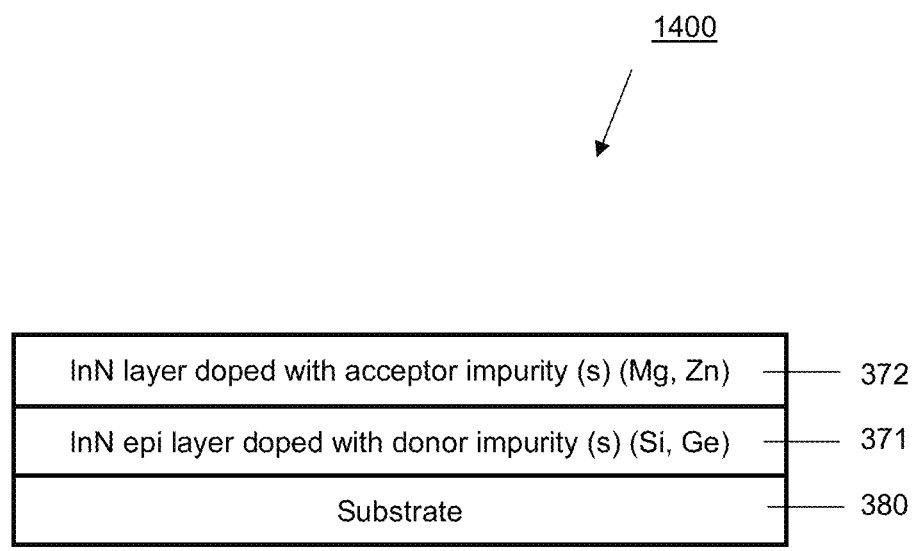
FIG. 14 illustrates an epitaxial structure including two different indium nitride layers having different doping characteristics according to one embodiment.

Referring to FIG. 14, in one embodiment, the first and second indium nitride epitaxial layers 371 and 372 have different dopants. In one embodiment, the first indium nitride layer 371 can include a magnesium dopant and/or a zinc dopant, and the second indium nitride layer 372 can include a silicon dopant and/or a germanium dopant. Further, the first and second indium nitride layers 371 and 372 can have different amounts of the same dopant so that the first and second indium nitride layers 371 and 372 have different dopant characteristics.

In the embodiments illustrated in FIGS. 13 and 14, the epitaxial structures 1300 and 1400 include two indium nitride layers 371 and 372. In alternative embodiments, other numbers of indium nitride layers may be grown. For example, referring to FIG. 15, an epitaxial structure 1500 includes three indium nitride layers 371, 372 and 373 on a substrate 380. In the illustrated embodiment, each layer differs from the other layers so that each layer has a unique set of properties, e.g., umque electrical, optical and/or physical properties, as discussed above.

Figure 15:
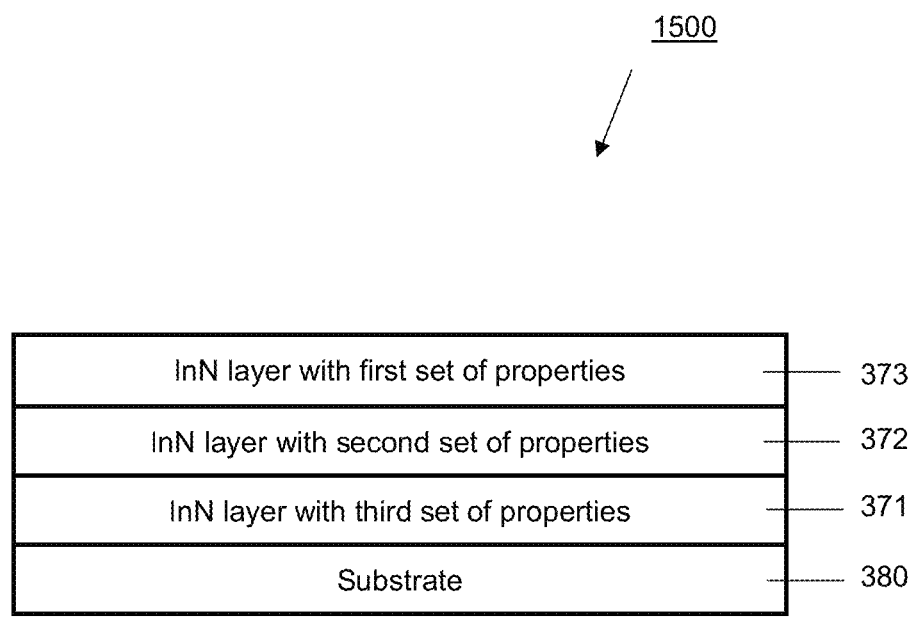
FIG. 15 illustrates an epitaxial structure including three different indium nitride layers according to one embodiment.

In the embodiments shown in FIGS. 13-15, an indium-containing layer is grown directly on another indium-containing layer. In alternative embodiments, a layer that is not indium nitride can separate the first and second indium nitride layers.

Growth of Group III-V Layer I Indium Nitride by HVPE

Figure 16:
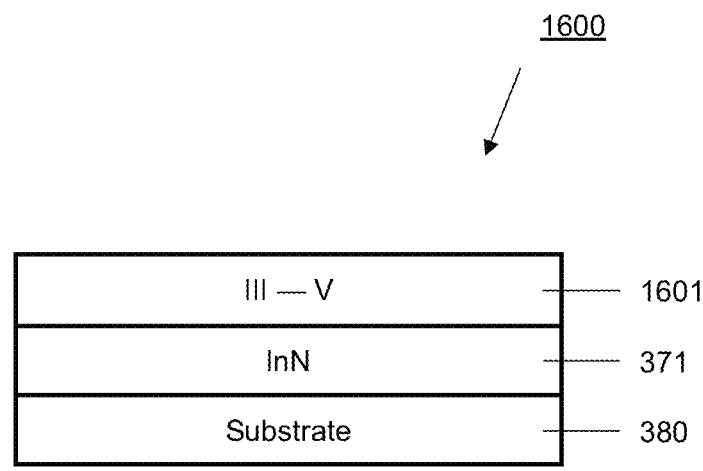
FIG. 16 illustrates an epitaxial structure including an indium nitride layer on a substrate, and a different layer on the indium nitride layer according to one embodiment.
Figure 17:
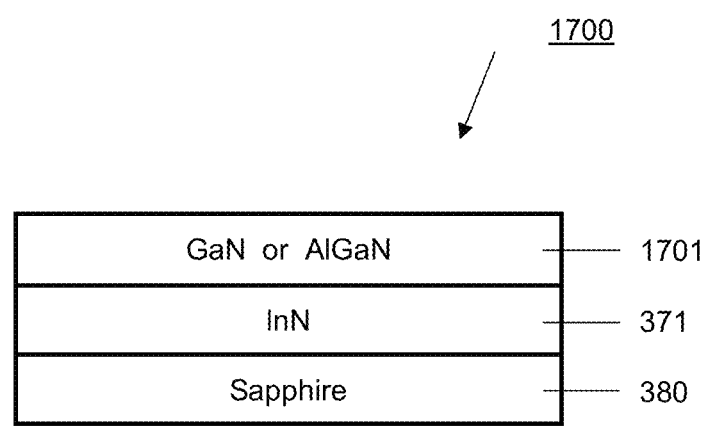
FIG. 17 further illustrates an epitaxial structure as shown in FIG. 16.
Figure 18:
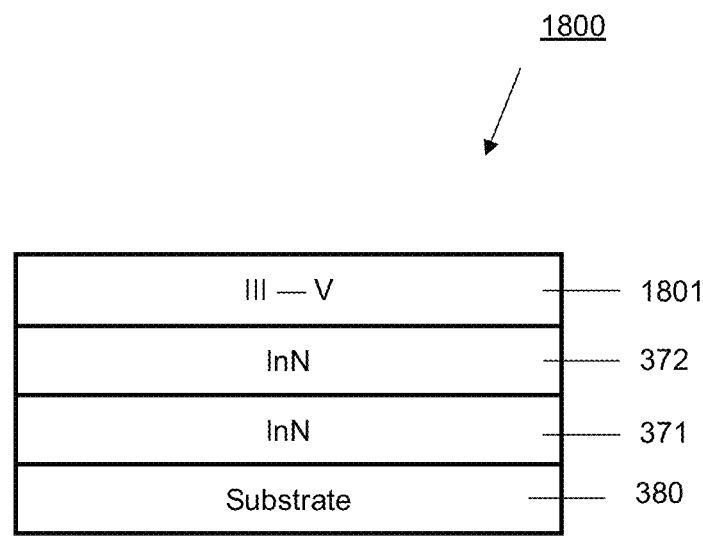
FIG. 18 illustrates an epitaxial structure including two indium nitride layers and a different layer grown on an indium nitride layer.
Figure 19:
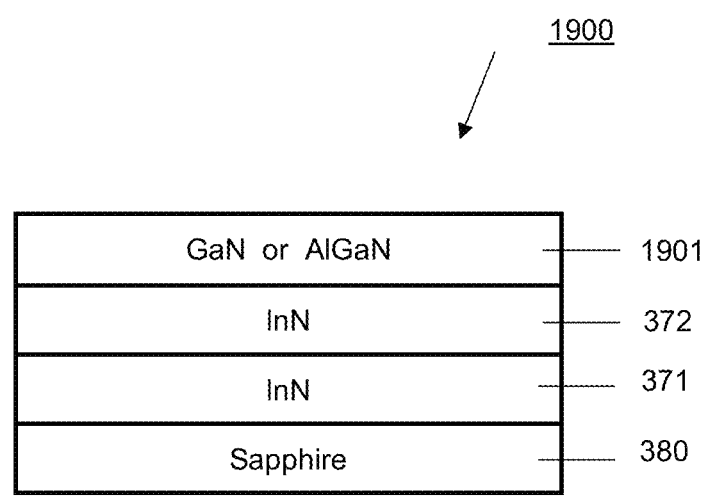
FIG. 19 illustrates an epitaxial structure as shown in FIG. 18.

Referring to FIG. 16, according to another embodiment, an epitaxial structure 1600 that can be grown in a HVPE reactor and method embodiments includes an indium nitride layer 371 grown on a substrate 380 and another material, e.g., a Group III-V layer 1601, other than an indium nitride layer, grown on the InN layer 371. Suitable other materials that can be grown on the InN layer 371 include metals, p-type semiconductors, n-type semiconductors, and dielectrics. Referring to FIG. 17, in one embodiment, an epitaxial structure 1700 that can be grown by HVPE reactor and method embodiments includes a GaN or AlGaN layer 1701 grown on the indium nitride layer 371. Referring to FIG. 18, in a further alternative embodiment, an epitaxial structure 1800 that can be grown by HVPE reactor and method embodiments includes a first indium nitride layer 371 grown on a substrate 380, a second indium nitride layer 372 grown on the first indium nitride layer 371, a Group III-V layer 1801, other than an InN layer, grown on the second InN layer 372. Referring to FIG. 19, according to one embodiment, an epitaxial structure 1900 that can be grown includes a GaN or AlGaN layer 1901, which may include p-type layers. As discussed above with respect to FIGS. 13-15, the first and second indium nitride layers 371 and 372 can be different from each other, e.g., they have different doping or other physical or optical characteristics.

Growth of Indium Nitride/Group III-V Layer by HVPE

Figure 20:
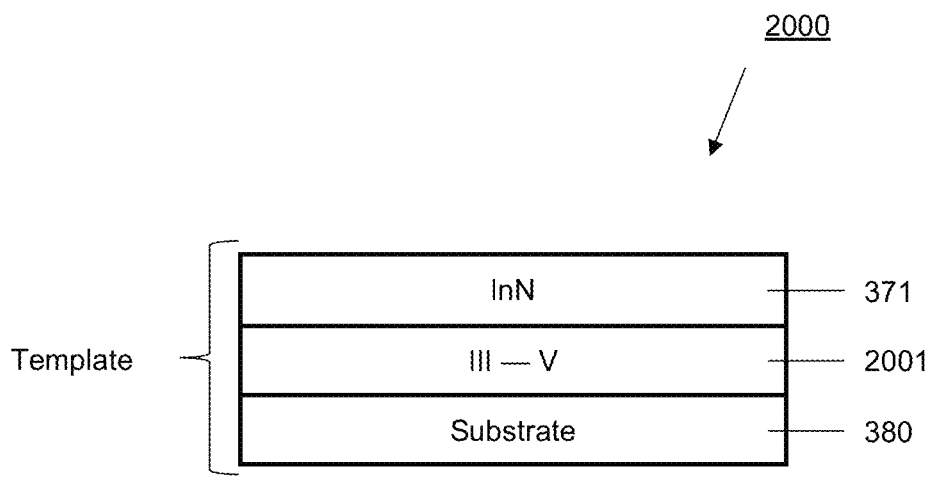
FIG. 20 illustrates an epitaxial structure including a first layer grown on a substrate and an indium nitride layer grown on the first layer.
Figure 21:
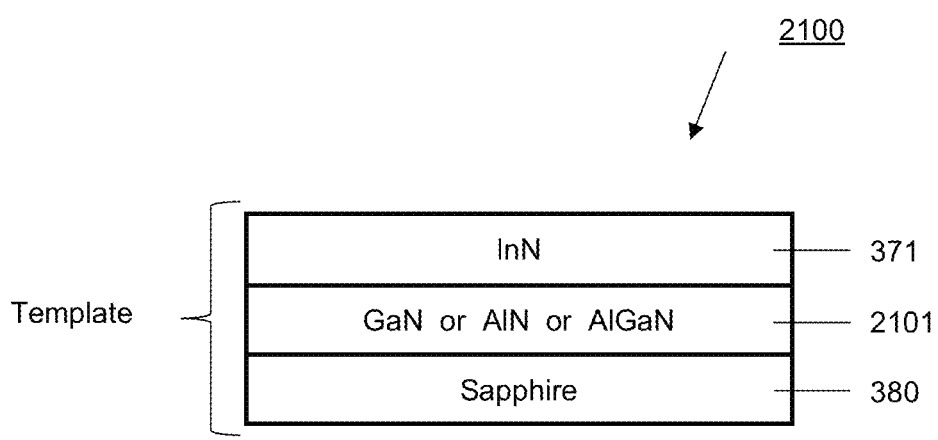
FIG. 21 illustrates an epitaxial structure shown in FIG. 20.

Referring to FIG. 20, according to another embodiment, an epitaxial structure 2000 that can be grown using HVPE reactor and method embodiments includes a group III-V layer 2001, which is not an InN layer, grown on a substrate 380, and an indium nitride layer 371 grown on the group III-V layer 2001. In other words, an indium nitride layer 371 is grown on a group III-V/sapphire template. Referring to FIG. 21, according to one embodiment, an epitaxial structure 2100 includes a GaN, an AlN or an AlGaN layer 2101 grown on a sapphire substrate 380.

Figure 22:
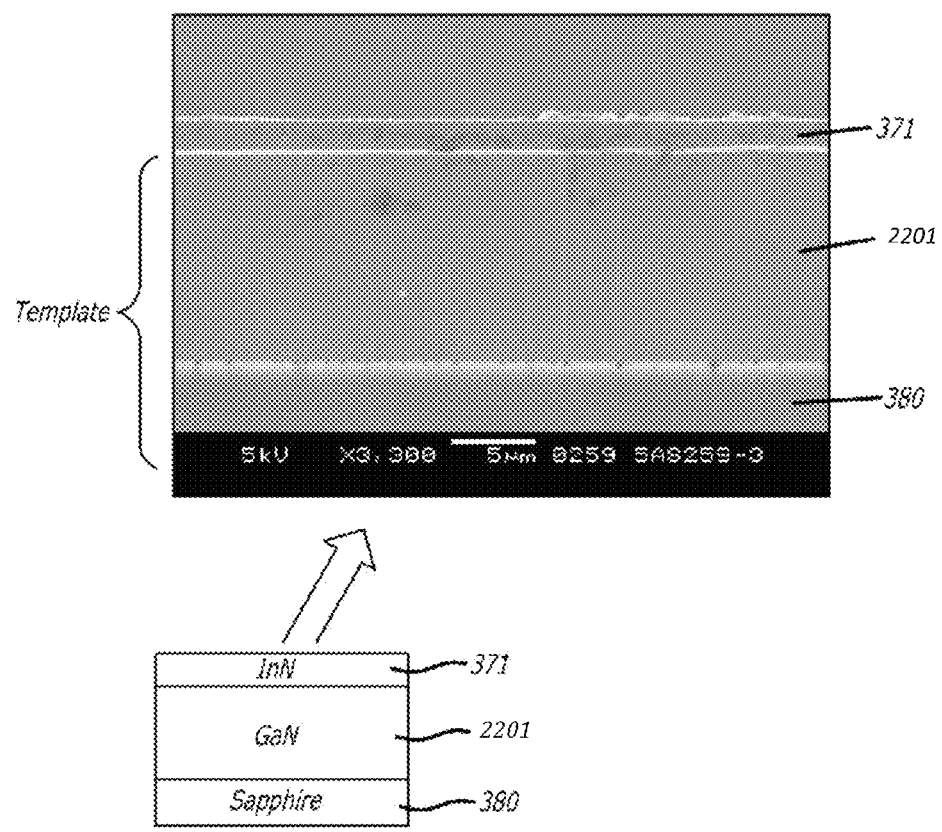
FIG. 22 is a SEM image of cleaved edge of an indium nitride layer grown on a gallium nitride/sapphire template.

For example, referring to FIG. 22, according to one embodiment, an epitaxial structure 2200 was grown using HVPE reactor and method embodiments and included a template formed by a GaN layer 2201 on a sapphire substrate 380, and an indium nitride layer 371 grown on the GaN layer 2201. The diameter of the template was about two inches. The thickness of the GaN layer 2201 was about 20 microns, and the thickness of the indium nitride layer 371 was about 1.5 microns. The thickness uniformity (thickness standard deviation for 2-inch wafer) for the InN layer 371 was better than 5%. The average HVPE growth rate for the indium nitride layer 371 was about 1.5 microns per hour. The grown indium nitride layer 371 had a smooth mirror like surfaces. The surface roughness, rms, of the indium nitride layer 371, measured by AFM was 1.5 nm for a 5×5 micron AFM scan. The surface crystalline structure was studied by reflectance high energy electron diffraction revealed a single crystalline surface. A RHEED image contained well defined Kikuchi lines and vertical rods indication high crystalline quality of the as grown surface.

Structural characterization of the indium nitride layer 371 shown in FIG. 22 was performed using x-ray diffraction methods. X-ray measurements using ω-2Θ scanning geometry showed that the indium nitride layer 371 that was grown had a single crystalline structure. Only x-ray diffraction peaks from the indium nitride layer 371 and from the template substrate materials were presented in the scan, as shown in FIG. 23. No traces of indium metal were detected in the grown materials.

Figure 24:
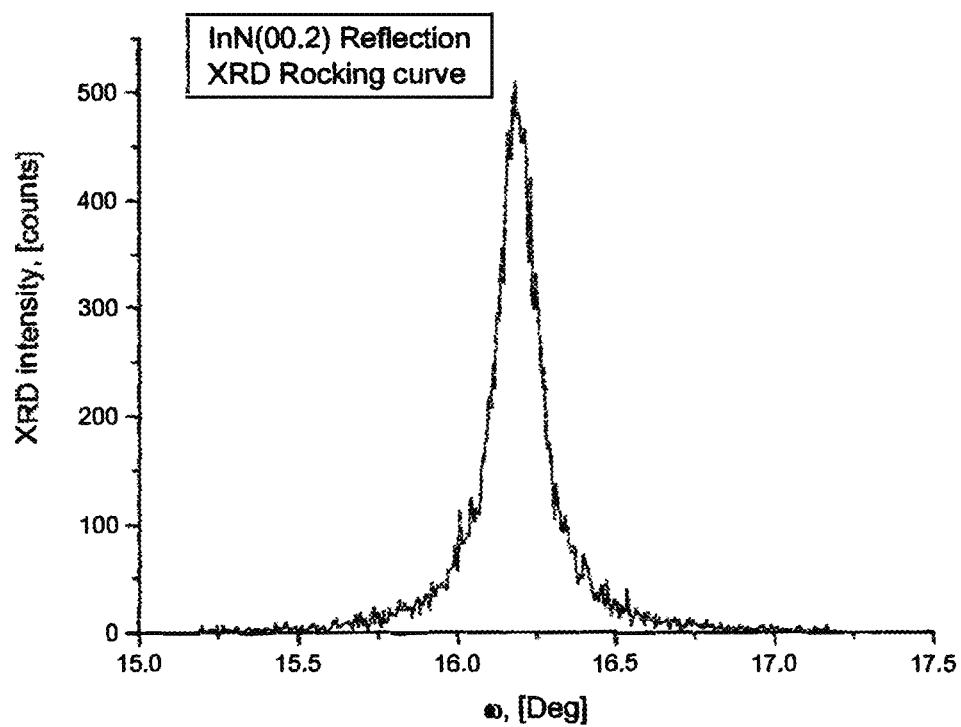
FIG. 24 is an x-ray rocking curve for the (00.2) InN reflection measured using co-scanning geometry (FWHM=548 arc sec) for an indium nitride layer grown on a GaN/sapphire template.

X-ray rocking curve full width at half maximum (FWHM) was measured for the (00.2) (FIG. 24) and (10.2) InN reflections using ro-scanning geometry. Typical FWHM values are below 300 arc seconds and 1200 arc seconds, respectively, and rocking curves for InN layers grown on GaN have the FWHM below 80 arc seconds for 0-20 scan.

The indium nitride layer 371 that was grown had n-type conductivity with electron concentration from $10^{16}$ to $10^{19}$ cm$^{-3}$. Electrical parameters uniformity for 2-inch wafer was better than 30%. For samples with carrier concentration ~$7\times10^{18}$ cm$^{-3}$ the optical absorption edge and photoluminescence peak position were around 0.85 eV (FIG. 25).

Figure 26:
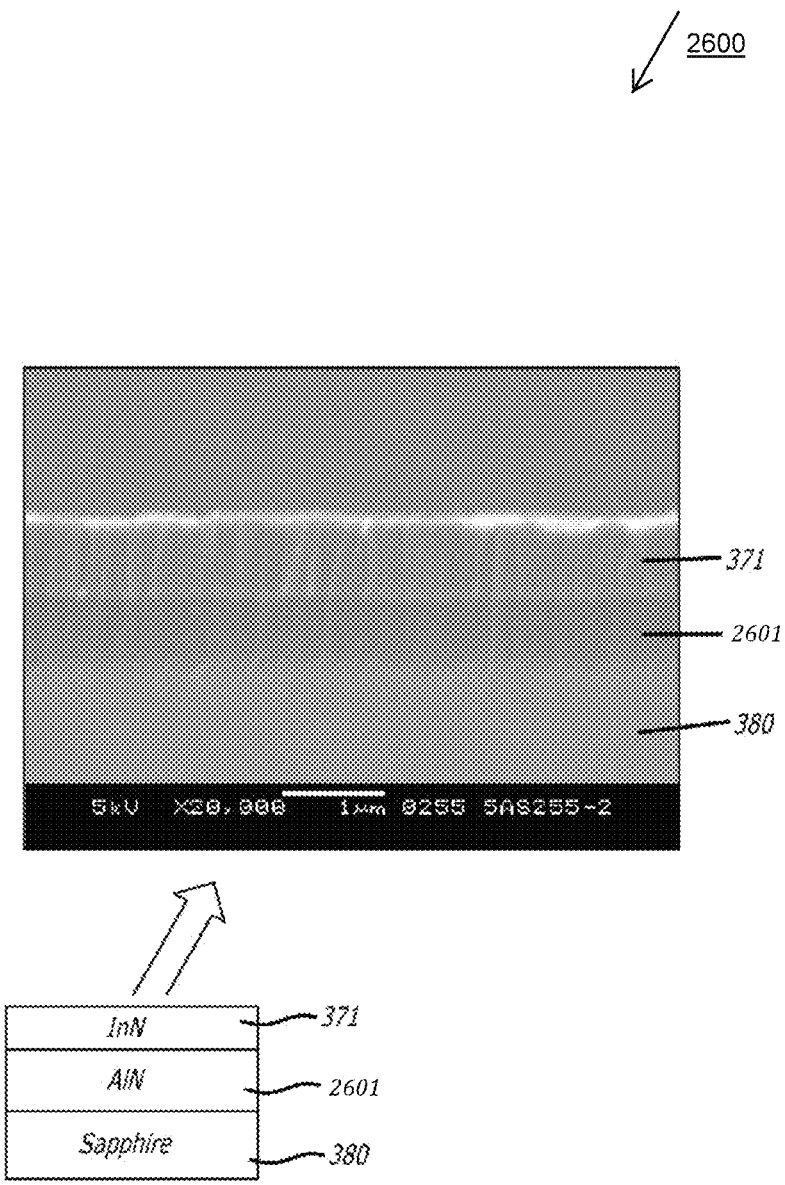
FIG. 26 is a SEM image of a cleaved sample comprising indium nitride layer grown on an aluminum nitride/sapphire template.

Referring to FIG. 26, according to another embodiment, HVPE reactor and method embodiments were also successfully utilized to produce an epitaxial structure 2600 that included a template formed by an AlN layer 2601 on a sapphire substrate 380, and an indium nitride layer 371 grown on the AlN layer 2601. Tests were also performed by growing an indium nitride layer 371 on AlGaN (not shown). In both of the AlN and AlGaN tests, the diameter of the template was two inches.

Indium nitride layers 371 that were grown on AlN and AlGaN exhibit wider x-ray rocking curves compared to indium nitride 371 grown on GaN. For example, the indium nitride layers grown on AlN and AlGaN ranged from about 500 arc sec to about 2700 arc seconds for the (00.2) reflections and from about 1000 to about 2700 arc seconds for the (10.2) reflections. X-ray diffraction FWHM maps measured for the entire 2-inch wafers resulted in standard deviations for the (00.2) and (10.2) reflections of less than 10%.

Figure 27:
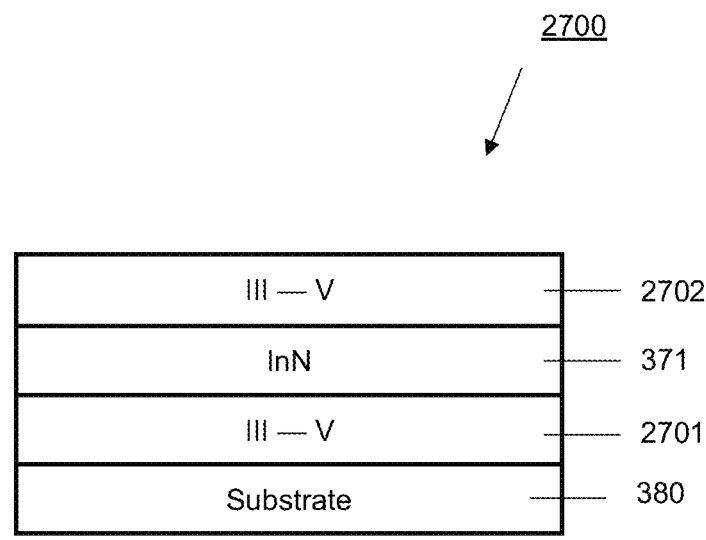
FIG. 27 illustrates an epitaxial structure including an indium nitride layer and two different layers.
Figure 28:
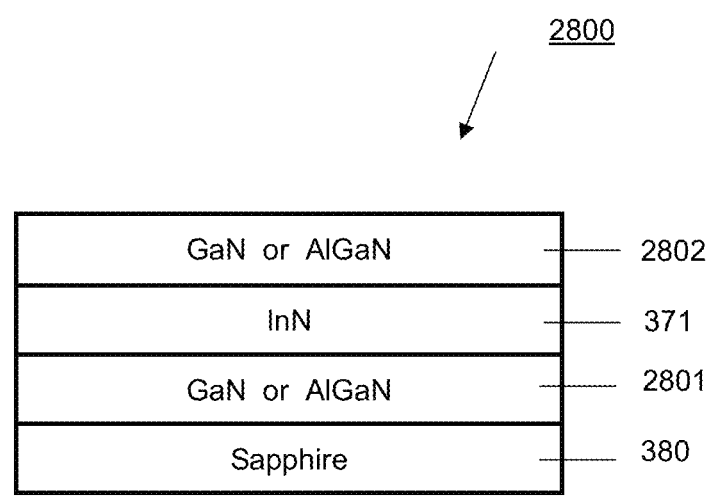
FIG. 28 further illustrates an epitaxial structure as shown in FIG. 27.

Referring to FIG. 27, an epitaxial structure 2700 according to another embodiment that can be grown using HVPE reactor and method embodiments includes an indium nitride layer 371 and two group III-V layers 2701 and 2702, which are not InN layers. Referring to FIG. 28, an epitaxial structure 2800 that can be grown using HVPE reactor and method embodiments includes group III-V layers that are GaN or AlGaN layers 2801 and 2802 grown on a sapphire substrate 380.

Figure 29:
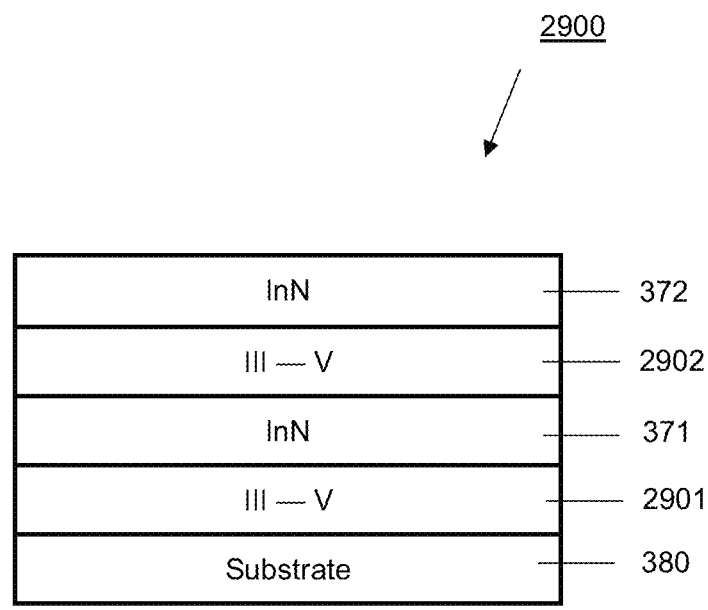
FIG. 29 illustrates an epitaxial structure including two group III-V layers and two indium nitride layers.
Figure 30:
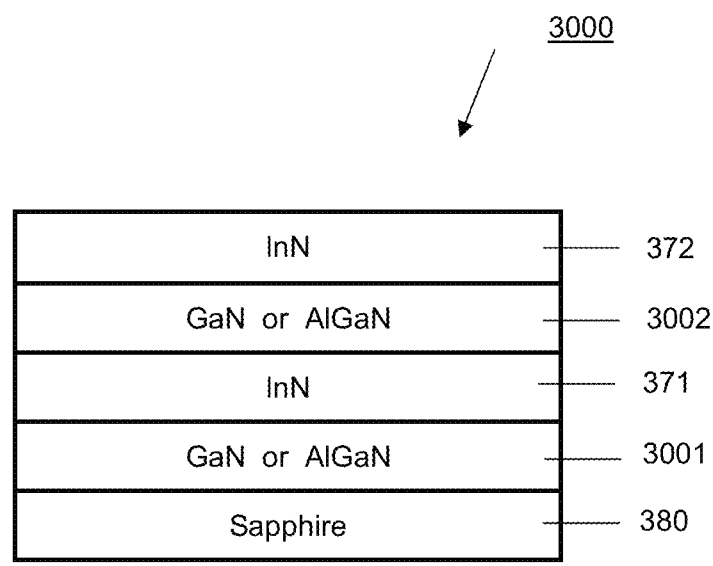
FIG. 30 further illustrates an epitaxial structure as shown in FIG. 29.

Referring to FIG. 29, an epitaxial structure 2900 according to another embodiment that can be grown using HVPE reactor and method embodiments includes two indium nitride layers 371 and 372 and two group III-V layers 2901 and 2902, which are not InN layers. Referring to FIG. 30, an epitaxial structure 3000 that can be grown using HVPE reactor and method embodiments includes group III-V layers that are GaN or AlGaN layers 3001 and 3002 grown on a sapphire substrate 380.

Figure 31:
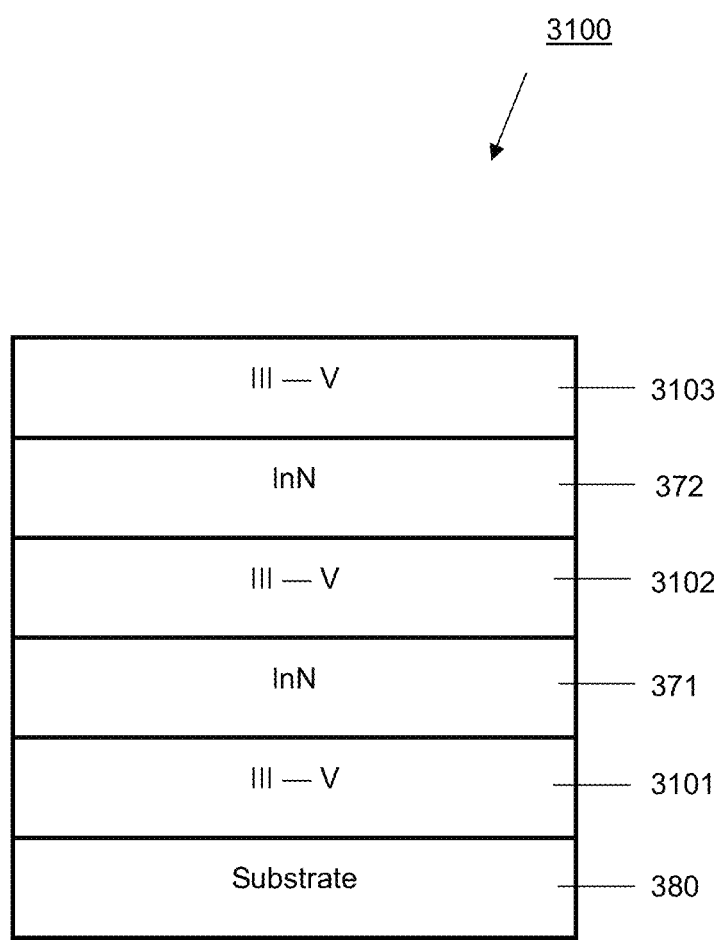
FIG. 31 illustrates an epitaxial structure including three group III-V layers and two indium nitride layers.
Figure 32:
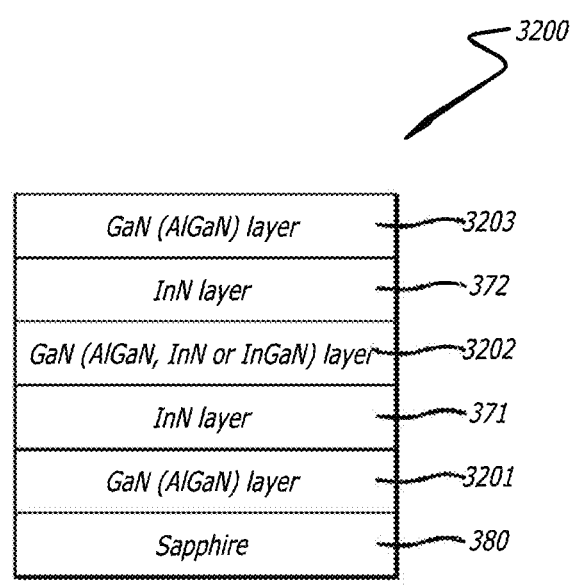
FIG. 32 further illustrates an epitaxial structure as shown in FIG. 31.

Referring to FIG. 31, an epitaxial structure 3100 according to another embodiment that can be grown using HVPE reactor and method embodiments includes two indium nitride layers 371 and 372 and three group III-V layers 3101-3103, which are not InN layers. Referring to FIG. 32, an epitaxial structure 3200 that can be grown using HVPE reactor and method embodiments includes a first group III-V layer 3101 that is a GaN or AlGaN layer 3201, a second group III-V layer 3102 that is a GaN or an AlGaN layer 3202, and a third or top group III-V layer 3103 that is a GaN or AlGaN layer 3203. In further alternative embodiments, as shown in FIG. 32, one or more of the group III-V layers may also include indium. For example, the second or middle group III-V layer 3202 can include InN or InGaN.

Persons skilled in the art will appreciate that various combinations of InN layers and other group III-V layers can be prepared using HVPE reactor and method embodiments for different applications and for use in fabricating various types of structures and devices. Accordingly, the illustrated epitaxial structures are provided as examples of how embodiments can be implemented.

Growth of Indium Nitride Micro- and Nano-Structures by HVPE

Figure 33:
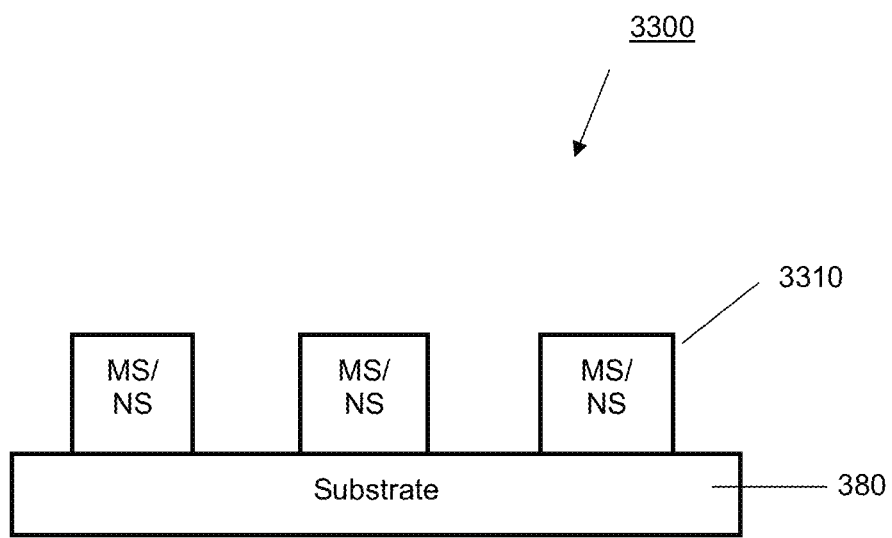
FIG. 33 generally illustrates indium nitride nano-structures grown on a substrate.

Referring to FIG. 33, according to another embodiment, HVPE apparatus and method embodiments can be used to grow structures 3300 including indium nitride nano-structures or elements ("NS") and indium nitride micro-structures or elements ("MS") (generally 3310) on a substrate 380. According to one embodiment, indium nitride nano-structures 3310 are grown on a sapphire substrate 380, and indium-nitride micro-structures 3310 are grown on an aluminum nitride substrate 380.

Figure 34:
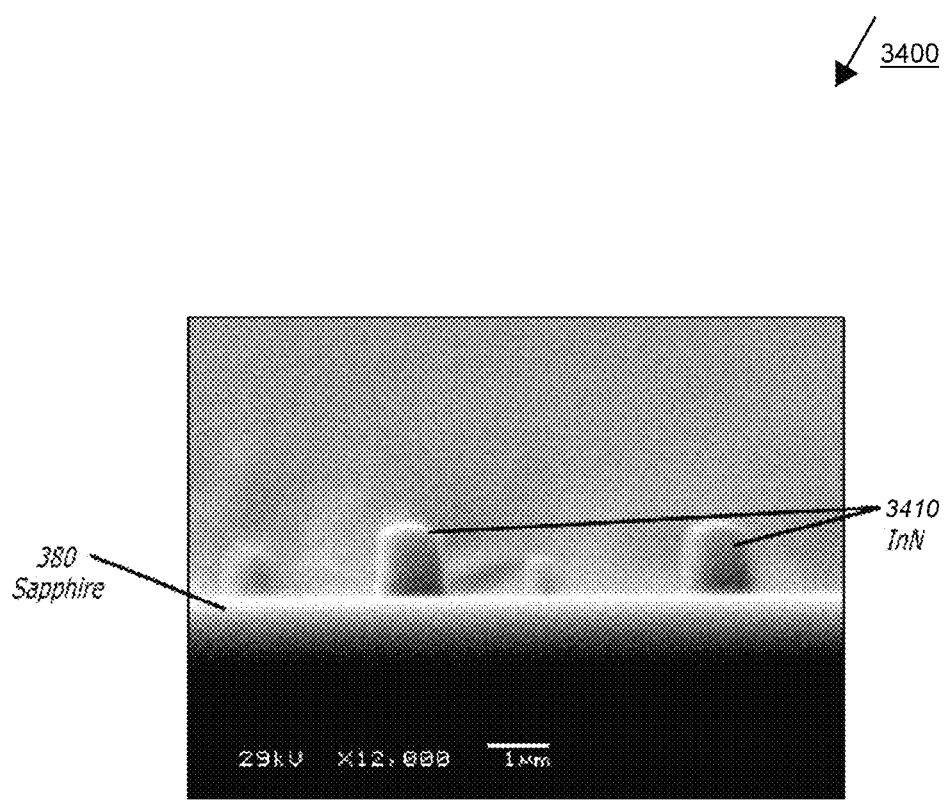
FIG. 34 is a SEM image of indium nitride nano-structures grown on sapphire.
Figure 35:
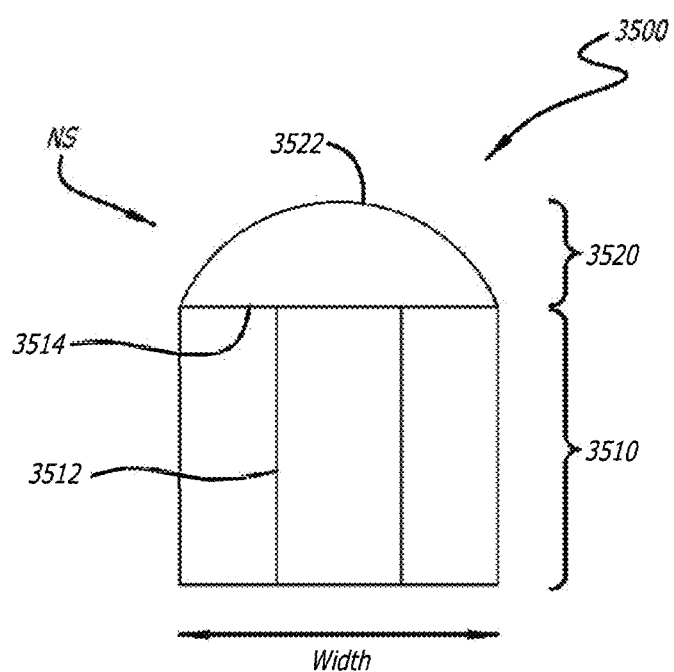
FIG. 35 further illustrates a nano-structure shown in FIG. 34.

Referring to FIG. 34, according to another embodiment, a structure 3400 grown using HVPE and method embodiments includes one or more indium nitride nano-structures or crystals 3410 that are grown on a sapphire substrate 380. As shown in FIGS. 35, an indium nitride nano-structure 3500 can have a main body 3510 and a tapered, rounded or beveled top portion 3520 extending from the main body 3510. In the illustrated embodiment, the main body 3510 is generally cylindrical and has a crystalline or faceted surface with facet lines 3512 extending between the top and the bottom of the main body 3510. The top surface 3522 of the top portion 3520 is at an angle relative to the top 3514 of the main body 3510. According to one embodiment, the width or diameter of each nano-structure 3510 is about several nm to more than 1 micron, and the height (length) from several nm to about 2 microns. Thus, the structures are described as a "nano" structure since they may have dimensions on a nano-meter scale, but such structures may also be larger and have dimensions that exceed a micron. In the illustrated embodiment, the nano-structures 3510 extend upwardly from the substrate 380 and are substantially perpendicular to the substrate 380 so that they are substantially parallel to each other.

High quality, low defect density indium nitride nano-structures 3410 have material qualities that are similar to the qualities of grown indium nitride epitaxial layers. For example, characterization of the grown nano-structures 3410 was performed using x-ray diffraction, which revealed that grown materials had single crystalline structure. All structures were well oriented. No free metallic indium inclusions were observed in grown structures as shown by x-ray diffraction ω-2Θ scan.

Figure 36:
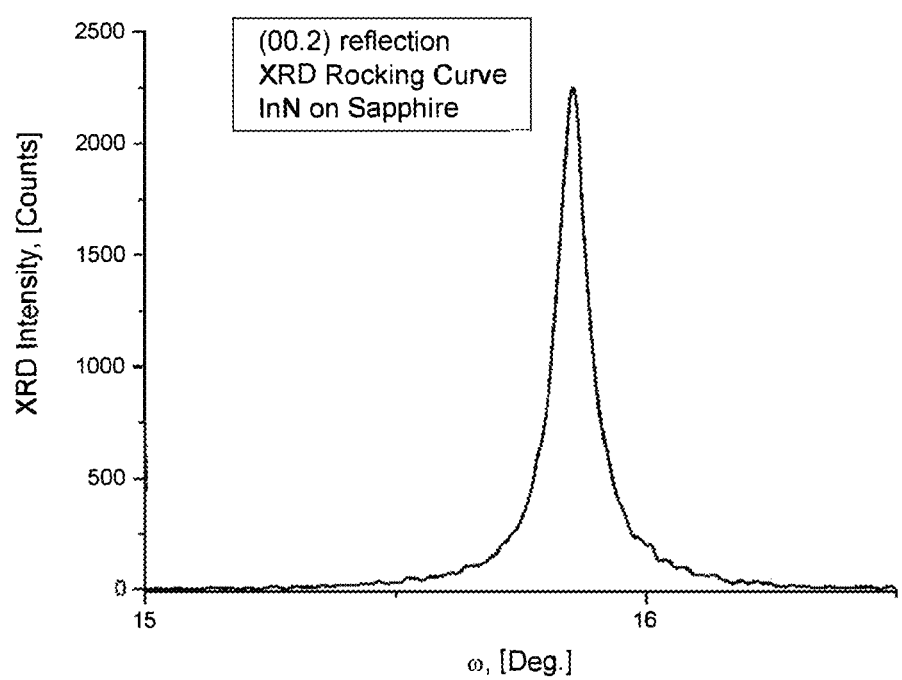
FIG. 36 is an x-ray rocking curve for the (00.2) InN reflection measured using co-scanning geometry (FWHM=270 arc sec) measured for nano-structures grown on sapphire.
Figure 37:
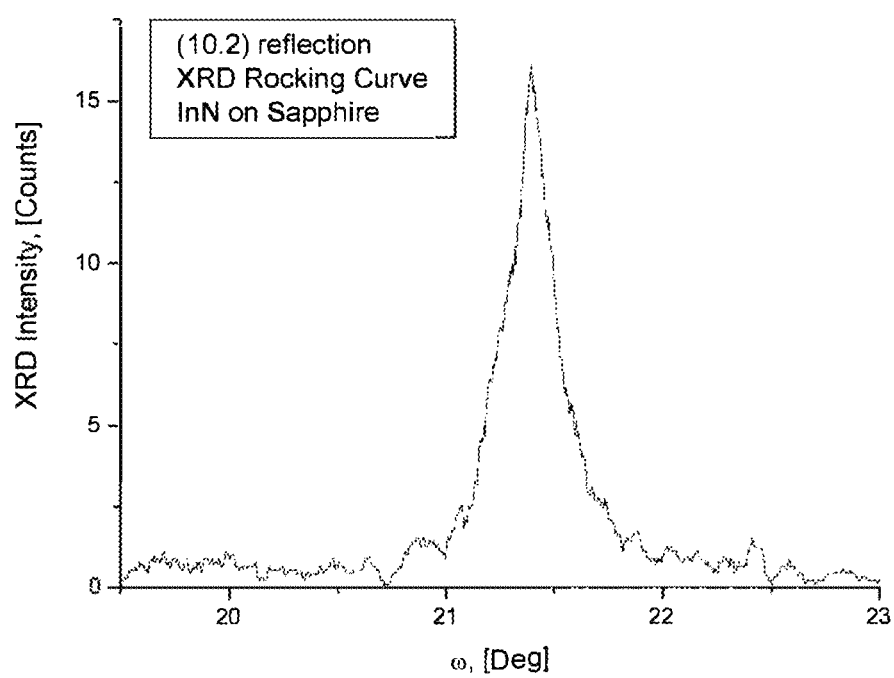
FIG. 37 is an x-ray rocking curve for the (10.2) InN reflection measured using co-scanning geometry (FWHM=964 arc sec) measured for nano-structures grown on sapphire.

In one embodiment, an indium-nitride structure has a full width at half maximum (FWHM) of an x-ray omega scan rocking curve less than about 1000 arc 25 seconds for a (10.2) peak, and a full width at half maximum (FWHM) of an x-ray rocking curve less than 600 arc seconds for a (00.2) peak. For example, referring to FIGS. 36 and 37, the rocking curves (omega scan) shows the FWHM of 270 arc seconds or below for symmetric InN (00.2) reflection (FIG. 36) and 964 arc seconds or below for asymmetric InN (10.2) reflection (FIG. 37). Tests that were conducted that also show 30 that the shape and size of indium nitride nano-structures 3410 including nano-rods, nanodots, and nano-wires may be controlled by varying growth parameters including growth temperature and gas flows. Higher temperatures in the growth zone promote indium nitride decomposition and higher ammonia flows resulted in columnar growth. Continuous indium nitride layers can also be formed by closely packed InN nanostructures 3410.

Figure 38:
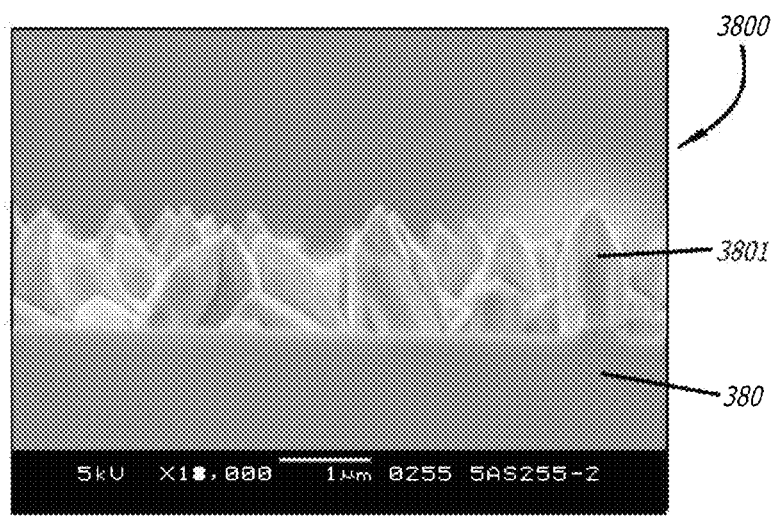
FIG. 38 is a SEM image of indium nitride micro-structures grown on aluminum nitride.

Referring to FIG. 38, indium nitride micro-structures 3800 according to a further embodiment grown using HVPE reactor and method embodiments on an AlN nitride substrate 380 can be in the form of InN micro-crystals 3801. The growth process that was utilized is the same as discussed above with respect to the nano-structures 3410, except that an AlN substrate 380 was utilized rather than a sapphire substrate or a template including GaN or AlGaN.

Having described HVPE apparatus and method embodiments and embodiments of indium nitride materials and related structures, it will be apparent that HVPE and method embodiments can produce improved indium nitride materials that can be used in various applications and in various devices. For example, if a base indium nitride layer is doped to form material having p-type conductivity, for example p-AlGaN, a p-AlGaN/n-InN heterojunction can be fabricated. Further, a n-InN/i-GaN heterostructure and other heterostructures can be fabricated with embodiments. Further, the thickness of indium nitride layers in such heterostructures can be controlled so that the thickness of an indium nitride layer can be controlled and be from a fraction of a nanometer to several millimeters.

Further, during indium nitride growth, deposition parameters can be varied to control indium nitride to, for example, provide multi layer indium nitride structures with controlled conductivity. According to one embodiment, a $n^+$-InN/n-InN/$n^+$-InN structure can be fabricated.

Additionally, structures grown using HVPE apparatus and method embodiments can have an indium nitride layer that is doped with acceptor impurity and another indium nitride layer that is doped with donor impurity, or undoped. As a result, grown indium nitride layers have different electrical conductivity. Sharp interfaces between indium nitride layers can be achieved by removing the substrate and grown layer from the growth zone prior to deposition of the next indium nitride layer and flashing the removed substrate/layer by inert gas. The gas mixture for deposition of the next indium nitride layer is prepared, and the substrate/layer are placed back in the growth zone and growth of the next InN (InGaN) layer is performed. Formed InN/InN junctions can be used as elements of various semiconductor devices including diodes, transistors, and sensors.

Although particular embodiments of the present invention have been shown and described, it should be understood that the above discussion is not intended to limit the present invention to these embodiments. Persons skilled in the art will appreciate that various changes and modifications may be made without departing from the spirit and scope of embodiments of the invention. Thus, embodiments are intended to cover alternatives, modifications, and equivalents that may fall within the scope of embodiments as defined by the claims.

What is claimed is:

1. A method to operate a hydride vapor phase epitaxy reactor for growing indium nitride on a substrate, comprising:

holding an indium material in an indium source boat disposed within a generation zone inside the reactor;

introducing HCl gas through an HCl gas source tube into the generation zone to react with the indium material within the generation zone to create a first gas product that includes the indium material;

introducing a carrier gas through a carrier gas source tube into the generation zone, the carrier gas transporting the first gas product from the generation zone to an accumulation zone between the generation zone in the reactor and a growth zone in the reactor;

receiving the first gas product from the generation zone into the accumulation zone;

collecting, with a collection vessel disposed within the accumulation zone, a condensate that includes the indium material and that results from condensation of the first gas product that flows into the accumulation zone when the accumulation zone is at a first temperature;

transitioning, during a reaction process, from the first temperature to collect the condensate in the accumulation zone to a second temperature to evaporate the condensate into a second gas product that includes the indium material;

when the accumulation zone is at the second temperature, evaporating the condensate collected by the collection vessel to generate the second gas product that includes the indium material inside the accumulation zone;

transferring the second gas product from the accumulation zone to the growth zone; and pre-heating the substrate in a pre-growth zone within the growth zone inside the reactor, before indium nitride is grown on the substrate; and with the substrate disposed within the growth zone, receiving in the growth zone the second gas product from the accumulation zone and a second reactive gas which react to cause growth of the indium nitride on the substrate.

2. The method of claim 1, wherein the indium material comprises a liquid including a compound containing indium.

3. The method of claim 1, wherein the indium material is a solid including a compound containing indium.

4. The method of claim 1, wherein the indium material includes $InCl_3$.

5. The method of claim 1, wherein the indium source boat is moveable inside the reactor.

6. The method of claim 1, wherein the accumulation zone and the growth zone are defined by different temperatures inside the reactor.

7. The method of claim 1, wherein the second reactive gas is ammonia.

8. The method of claim 1, wherein the generation zone, the accumulation zone and the growth zone within the reactor are controlled and configured and arranged relative to each other such that the HCl gas is absent within the growth zone during growth of the indium nitride within the growth zone.

* * * * *